(12) United States Patent
Singh et al.

(10) Patent No.: US 9,448,125 B2
(45) Date of Patent: Sep. 20, 2016

(54) DETERMINING ON-CHIP VOLTAGE AND TEMPERATURE

(75) Inventors: Abhishek Singh, San Jose, CA (US);
Wojciech Jakub Poppe, San Jose, CA (US); Ilyas Elkin, Sunnyvale, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 809 days.

(21) Appl. No.: 13/358,387

(22) Filed: Jan. 25, 2012

(65) Prior Publication Data
US 2013/0110437 A1 May 2, 2013

Related U.S. Application Data

(60) Provisional application No. 61/554,490, filed on Nov. 1, 2011.

(51) Int. Cl.
| | |
|---|---|
| *G01K 15/00* | (2006.01) |
| *G01R 35/00* | (2006.01) |
| *G01R 19/00* | (2006.01) |

(52) U.S. Cl.
CPC .......... *G01K 15/00* (2013.01); *G01R 35/005* (2013.01); *G01R 19/0084* (2013.01)

(58) Field of Classification Search
CPC . H03K 3/0315; G01K 15/00; G01R 19/0084
USPC .......................................................... 702/85
See application file for complete search history.

(56) References Cited

U.S. PATENT DOCUMENTS

| | | | |
|---|---|---|---|
| 4,922,140 A | 5/1990 | Gahle et al. | |
| 5,553,276 A | 9/1996 | Dean | |
| 5,835,553 A | 11/1998 | Suzuki | |
| 5,973,507 A | 10/1999 | Yamazaki | |
| 6,023,430 A | 2/2000 | Izumikawa | |
| 6,242,960 B1 | 6/2001 | Bae | |
| 6,401,018 B1 | 6/2002 | Oba et al. | |
| 6,535,013 B2 | 3/2003 | Samaan | |
| 6,535,071 B2 | 3/2003 | Forbes | |
| 6,724,225 B2 | 4/2004 | Joshi et al. | |
| 6,801,096 B1 | 10/2004 | Nariman et al. | |
| 6,854,100 B1 | 2/2005 | Chuang et al. | |
| 6,882,172 B1 | 4/2005 | Suzuki et al. | |
| 6,998,901 B2 | 2/2006 | Lee | |
| 7,064,620 B1 | 6/2006 | Lai et al. | |
| 7,085,658 B2 | 8/2006 | Bhushan et al. | |

(Continued)

FOREIGN PATENT DOCUMENTS

| | | |
|---|---|---|
| CN | 101144741 A | 3/2008 |
| CN | 102098028 A | 6/2011 |

(Continued)

OTHER PUBLICATIONS

Harshada Vinayak Khare, "Design of an On-chip Thermal Sensor using Leakage Current of a Transistor", Jan. 2010 Thesis University of Minnesota.*

(Continued)

*Primary Examiner* — Regis Betsch

(57) ABSTRACT

A method, in one embodiment, can include modeling and calibrating two types of sensors that are part of a semiconductor device. In addition, the method can include determining a temperature and voltage based on data received from the two sensors.

20 Claims, 21 Drawing Sheets

(56) References Cited

U.S. PATENT DOCUMENTS

| | | |
|---|---|---|
| 7,151,417 B1 | 12/2006 | Suzuki |
| 7,180,794 B2 | 2/2007 | Matsue |
| 7,282,975 B2 | 10/2007 | Burton et al. |
| 7,315,221 B2 | 1/2008 | Ha et al. |
| 7,332,937 B2 | 2/2008 | Hsu et al. |
| 7,365,611 B2 | 4/2008 | Ikeda et al. |
| 7,489,204 B2 | 2/2009 | Habitz et al. |
| 7,535,128 B2 | 5/2009 | Wang et al. |
| 7,550,998 B2 | 6/2009 | Brazis et al. |
| 7,592,876 B2 | 9/2009 | Newman |
| 7,642,864 B2 | 1/2010 | Chuang et al. |
| 7,760,033 B2 | 7/2010 | Podmanik et al. |
| 7,795,927 B2 | 9/2010 | Farwell |
| 7,804,372 B2 | 9/2010 | Nakatani |
| 7,868,706 B2 | 1/2011 | Nissar et al. |
| 7,908,109 B2 | 3/2011 | Good et al. |
| 8,041,518 B2 | 10/2011 | McIntyre et al. |
| 8,081,035 B2 | 12/2011 | Wood |
| 8,143,919 B2 | 3/2012 | Kurokawa |
| 8,193,833 B2 | 6/2012 | Inukai |
| 8,247,906 B2 | 8/2012 | Law et al. |
| 8,378,754 B2 | 2/2013 | Yamamoto |
| 2003/0001185 A1 | 1/2003 | Sell et al. |
| 2003/0034848 A1* | 2/2003 | Norman et al. ............ 331/46 |
| 2005/0007154 A1 | 1/2005 | Patella et al. |
| 2005/0012556 A1 | 1/2005 | Bhushan et al. |
| 2006/0028241 A1 | 2/2006 | Apostol et al. |
| 2006/0161797 A1* | 7/2006 | Grass ............ G06F 1/08 713/400 |
| 2006/0178857 A1 | 8/2006 | Barajas |
| 2007/0273450 A1* | 11/2007 | Burton et al. ............ 331/57 |
| 2008/0094053 A1 | 4/2008 | Han et al. |
| 2009/0045834 A1 | 2/2009 | Farwell |
| 2009/0096495 A1* | 4/2009 | Keigo ............ 327/142 |
| 2010/0102891 A1 | 4/2010 | Nissar et al. |
| 2010/0189160 A1 | 7/2010 | Kim et al. |
| 2010/0327983 A1 | 12/2010 | Yamamoto |
| 2011/0101998 A1* | 5/2011 | Myers et al. ............ 324/678 |
| 2013/0021107 A1 | 1/2013 | Poppe et al. |
| 2013/0027140 A1 | 1/2013 | Poppe et al. |
| 2013/0106438 A1 | 5/2013 | Elkin et al. |
| 2013/0106524 A1 | 5/2013 | Elkin et al. |

FOREIGN PATENT DOCUMENTS

| | | |
|---|---|---|
| DE | 102004001668 A1 | 8/2005 |
| DE | 102006005848 A1 | 8/2006 |
| DE | 102004001668 B4 | 9/2007 |
| DE | 10063996 B4 | 6/2009 |
| KR | 10-2001-0035660 A | 5/2001 |
| TW | 200403779 A | 3/2004 |
| TW | 200419688 A | 10/2004 |
| TW | 200943719 A | 10/2009 |
| TW | 201103116 A | 1/2011 |
| TW | 201118392 A | 6/2011 |

OTHER PUBLICATIONS

Basab Datta et al., "Analysis of a Ring Oscillator Based on Chip Thermal Sensor in 65nm Technology", VLSI Design Principles (ECE 658) Lab 4 Project, University of Massachusetts-Amherst, Dec. 23, 2005.

Klass, Fabian; "Design for Yield Using Statistical Design," EE380 Computer Systems Colloquium, Stanford University, Feb. 7, 2007.

* cited by examiner

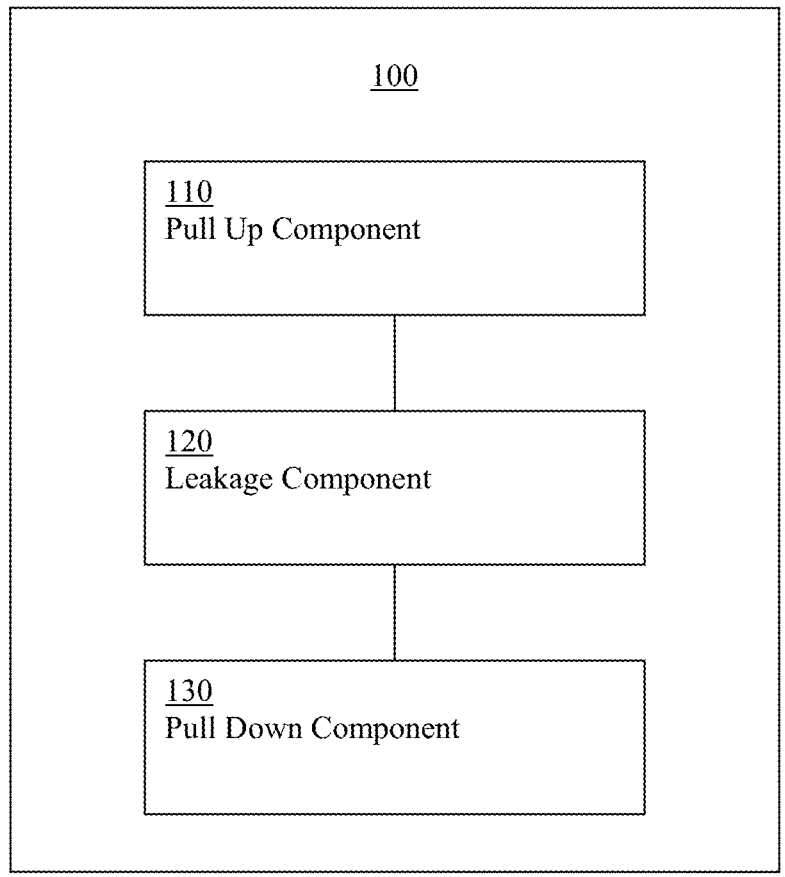
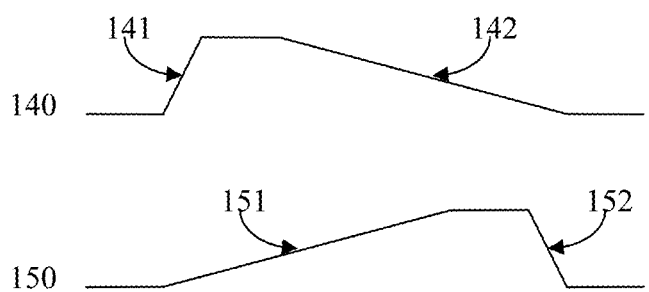
FIG 1

1800

| 1810 |
| Perform a leakage inversion process. |

| 1820 |
| Perform an analysis based on the leakage inversion process. |

1910
Receiving a first logical state signal.

1920
Changing a characteristic of at least one component.

1930
Outputting a second logical state signal, wherein a delay between receiving the first logical state signal and outputting the second logical state signal is impacted by a leakage current.

2010 Receiving an indication associated with a leakage characteristic.

2020 Determining a transition delay time, wherein the transition delay time is impacted by a leakage characteristic.

2030 Analyzing characteristics of a device based upon the transition delay time.

FIG 20

DETERMINING ON-CHIP VOLTAGE AND TEMPERATURE

CROSS-REFERENCE TO RELATED APPLICATIONS

This application claims the benefit of U.S. Provisional Patent Application No. 61/554,490, filed Nov. 1, 2011, entitled "Determining On-Chip Voltage And Temperature," by Wojciech J. Poppe et al., which is hereby incorporated by reference. In addition, the following U.S. patent applications are hereby incorporated by reference: U.S. patent application Ser. No. 13/287,044, filed Nov. 1, 2011, entitled "A System And Method For Examining Leakage Impacts," by Ilyas Elkin et al. and U.S. patent application Ser. No. 13/287,053, filed Nov. 1, 2011, entitled "A System And Method For Examining Asymmetric Operations," by Ilyas Elkin et al.

BACKGROUND

The shrinking device geometries of semiconductor devices and the advancements in lithography techniques have enabled increased semiconductor device densities in recent integrated circuit (IC) technologies. However, this has led to several challenges such as increased peak-power density and hot-spot migration caused by unpredictable workloads.

SUMMARY

A method, in one embodiment, can include modeling and calibrating two types of sensors that are part of a semiconductor device. In addition, the method can include determining a temperature and voltage based on data received from the two sensors.

A system, in an embodiment, can include a first sensor, a second sensor, and an analysis component coupled to receive an output from both the first and second sensors. The analysis component can be for performing a method including modeling and calibrating the first and second sensors that are part of a semiconductor device. Furthermore, the method can include determining a temperature and voltage based on data received from the first and second sensors.

A method, in an embodiment, can include modeling and calibrating a voltage sensitive sensor and a temperature sensitive sensor that are part of a semiconductor device. Note that the voltage sensitive sensor and the temperature sensitive sensor are in close proximity. Additionally, the method can include determining a temperature and voltage based on data received from the voltage sensitive sensor and the temperature sensitive sensor.

While a particular embodiment in accordance with the invention has been specifically described within this Summary, it is noted that the invention and the claimed subject matter are not limited in any way by this embodiment.

BRIEF DESCRIPTION OF THE DRAWINGS

Within the accompanying drawings, various embodiments in accordance with the invention are illustrated by way of example and not by way of limitation. It is noted that like reference numerals denote similar elements throughout the drawings. The drawings referred to in this description should not be understood as being drawn to scale except if specifically noted.

FIG. 1 is a block diagram of an exemplary leakage inverter in accordance with one embodiment of the invention.

FIG. 18 is a flow chart of exemplary analysis method in accordance with one embodiment of the invention.

FIG. 19 is a flow chart of exemplary leakage inversion process in accordance with one embodiment of the invention.

FIG. 20 is a flow chart of exemplary analysis process in accordance with one embodiment of the invention.

DETAILED DESCRIPTION

Figure 2:
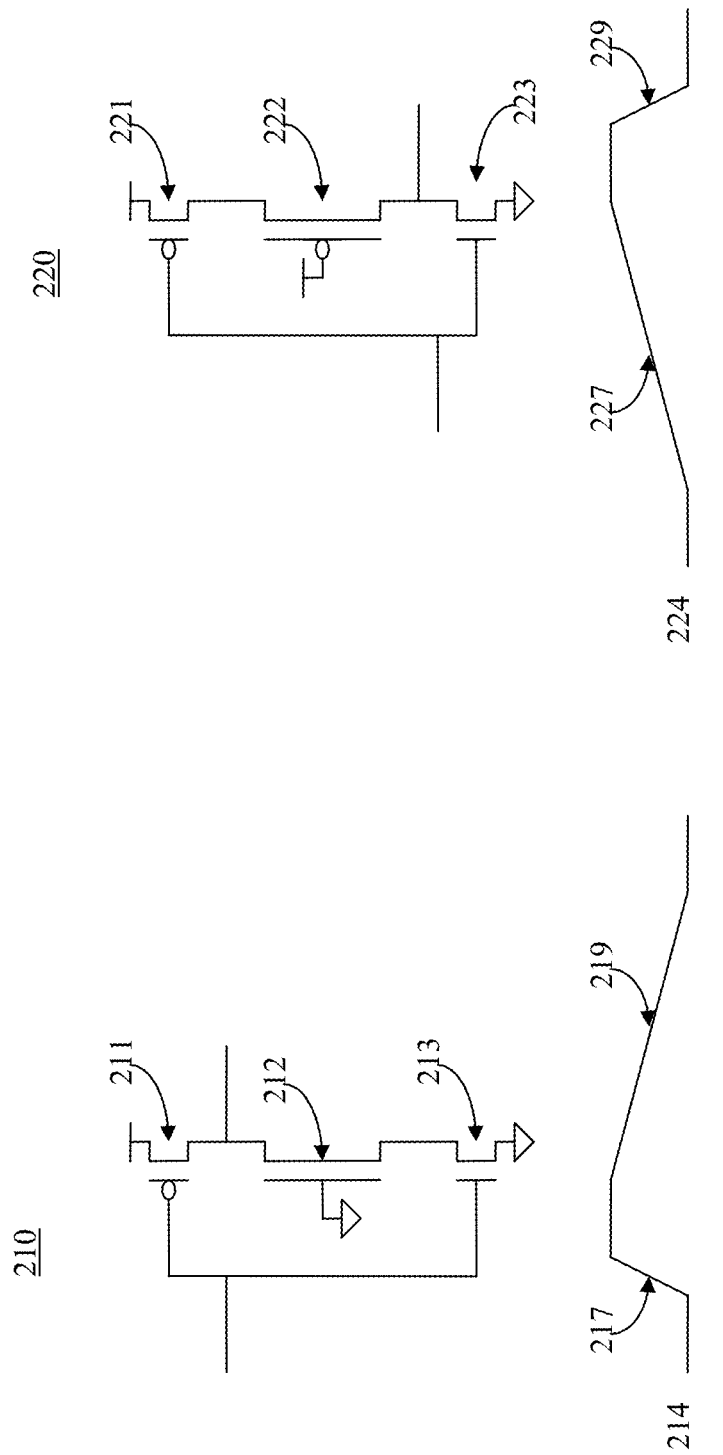
FIG. 2 is a block diagram of exemplary leakage inverters with MOS components in accordance with some embodiments of the invention.

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details or with equivalents thereof. In other instances, well known methods, procedures, components, and circuits have not been described in detail as not to unnecessarily obscure aspects of the invention.

It is appreciated that outputs from leakage component scenarios can be utilized in a variety of different analysis. In one embodiment, leakage inversion outputs can be utilized in detecting transition delays that are utilized to analyze a variety of concerns. In one exemplary implementation, the leakage inversion outputs can be utilized to analyze manufacturing process compliance and defects. In an embodiment, output(s) from one or more leakage ring oscillators can be utilized to determine the temperature at the location(s) of the one or more leakage ring oscillators during operation of a chip that includes the one or more leakage ring oscillators. In one embodiment, a leakage ring oscillator is located in close proximity to a standard ring oscillator, and output from the leakage ring oscillator and output from the standard ring oscillator can be utilized together to determine the temperature and voltage at the location of the leakage and standard ring oscillators during operation of a chip that includes these two types of ring oscillators. In an embodiment, multiple pairs of a leakage ring oscillator and a standard ring oscillator can be implemented in multiple locations of a die or chip to determine the temperature and voltage at those multiple locations during the operation of the die or chip.

FIG. 1 is a block diagram of an exemplary leakage inverter 100 in accordance with one embodiment of the invention. Leakage inverter 100 comprises a pull up component 110, leakage component 120 and pull down component 130. In one exemplary implementation, leakage component 120 is coupled in series between the pull up component 110 and the pull down component 130. The components of leakage inverter 100 cooperatively operate to pull up and pull down a signal. In one embodiment, pull up component 110 is configurable to perform a pull up operation to pull up a signal, pull down component 130 is configurable to perform a pull down operation to pull down the signal; and a leakage in leakage component 120 impacts at least one transition of the signal.

In one embodiment, a transition delay associated with the pull down operation is asymmetric with respect to transition delay associated with the pull up operation and the asymmetry is associated with an effect of the leakage current on the at least one transition of the signal. In one exemplary implementation, the at least one transition of the signal is represented by graph 140 with a relatively fast rising transition delay 141 and a relatively slow transition delay 142. In one exemplary implementation, the at least one transition of the signal is represented by graph 150 with a relatively slow rising transition delay 151 and a relatively fast transition delay 152. It is appreciated that pull up component 110, leakage component 120 and pull down component 130 can include a variety of components. In one embodiment, the leakage component includes a transistor in the off state that allows leakage current to flow.

FIG. 2 is a block diagram of exemplary leakage inverters with MOS components in accordance with some embodiments of the invention. It is appreciated there are a variety of other leakage inverter configurations. Leakage inverter 210 includes a NMOS leakage transistor 212 and leakage inverter 220 includes a PMOS leakage transistor 222.

Leakage inverter 210 includes pull up component PMOS transistor 211, leakage component NMOS leakage transistor 212 and pull down component NMOS transistor 213. In one exemplary implementation, the incoming signal is low and pull down component NMOS transistor 213 turns off, pull up component PMOS transistor 211 turns on to perform a pull up operation and leakage component NMOS transistor 212 does not impact an output signal transition to a pulled up value. In one exemplary implementation, the incoming signal is high and pull up component PMOS transistor 211 turns off, pull down component NMOS transistor 213 turns on to perform a pull down operation but leakage component NMOS transistor 212 impacts the output signal transition. As leakage component NMOS transistor 212 is off the pull down transition delay corresponds to a delay for leakage current and corresponding pull down value to "propagate" through the leakage component NMOS transistor 212. In one embodiment, the operations of leakage inverter 210 are represented by graph 214 with a relatively fast rising transition delay 217 and a relatively slow falling transition delay 219.

Leakage inverter 220 includes pull up component PMOS transistor 221, leakage component PMOS leakage transistor 222 and pull down component NMOS transistor 223. In one exemplary implementation, the incoming signal is high and pull up component PMOS transistor 221 turns off, pull down component NMOS transistor 223 turns on to perform a pull down operation and leakage component PMOS transistor 222 does not impact an output signal transition to a pulled down value. In one exemplary implementation, the incoming signal is low and pull down component NMOS transistor 223 turns off, pull up component PMOS transistor 221 turns on to perform a pull up operation but leakage component PMOS transistor 222 impacts the output signal transition. As leakage component PMOS transistor 222 is off the pull down transition delay corresponds to a delay for leakage current and corresponding pull up value to "propagate" through the leakage component PMOS transistor 222. In one embodiment, the operations of leakage inverter 220 are represented by graph 224 with a relatively slow rising transition delay 227 and a relatively fast falling transition delay 229.

It is appreciated that a leakage inverter can be included in a variety of component configurations. In one embodiment, the leakage inverter can be included in a ring configuration. In one exemplary implementation, the ring oscillator includes at least one leakage inverter configured to transition a signal, wherein a leakage current impacts a transition of the signal and the at least one leakage inverter is coupled as part of a ring path. The at least one leakage inverter can include a leakage component coupled in series between a pull up component and a pull down component, wherein leakage in the leakage component impacts at least one transition. The at least one leakage inverter can have a rising transition delay and a falling transition delay that are asymmetric. The ring oscillator can include an output including an indication of a transition delay in the signal and can include a control component coupled to the ring path to control a state of the signal. It is appreciated the ring oscillator can include a plurality of leakage inverters. In one exemplary implementation, at least one leakage inverter is coupled in series to another leakage inverter in the ring path.

Figure 3:
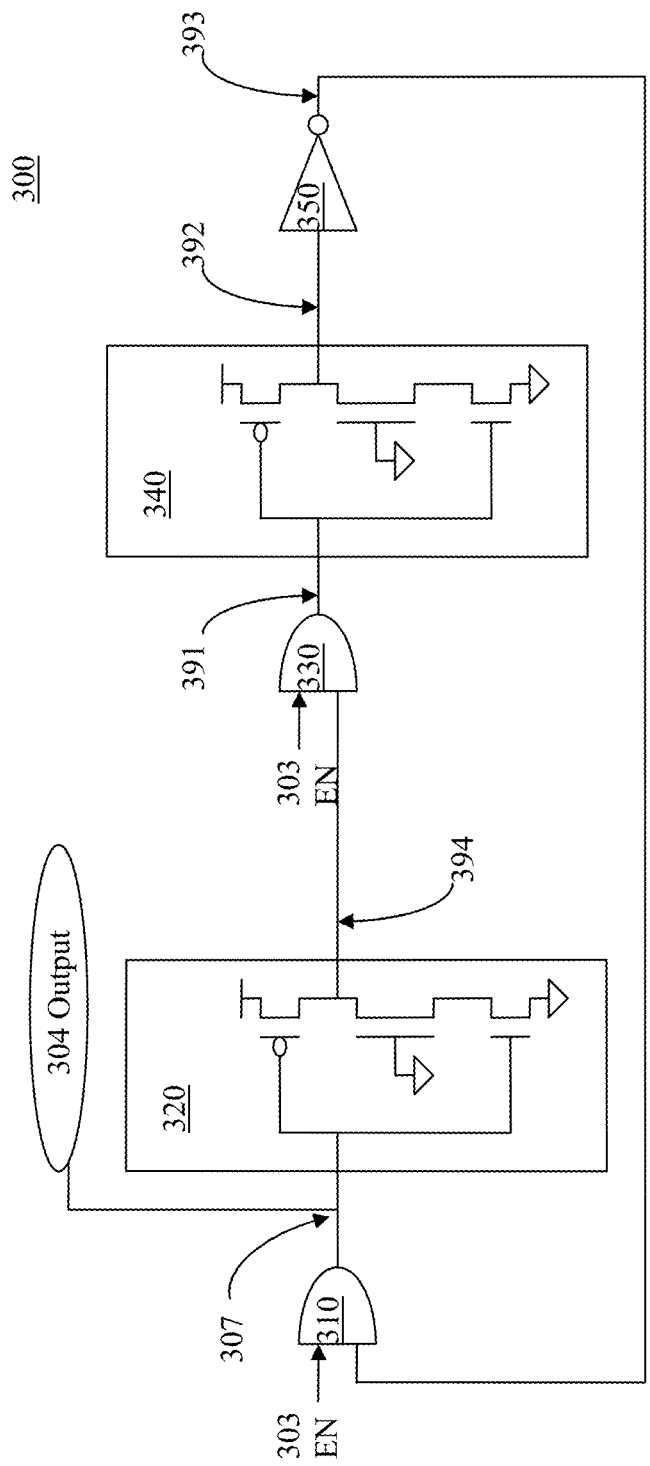
FIG. 3 is a block diagram of an exemplary ring oscillator in accordance with one embodiment of the invention.

FIG. 3 is a block diagram of exemplary ring oscillator 300 in accordance with one embodiment of the invention. Ring oscillator 300 includes leakage inverters 320 and 340, AND logic components 310 and 330, and driven inverter 350. The components are coupled in series in a ring path. Leakage inverters 320 and 340 include NMOS leakage transistors.

The components of ring oscillator 300 cooperatively operate to oscillate a signal. In one embodiment, oscillations include inversions of a signal state. Leakage inverters 320 and 340 oscillate or invert a signal state wherein at least one inversion transition is impacted by a leakage characteristic of a leakage inverter. In one exemplary implementation, the oscillation rising transitions and falling transitions have asymmetric transition delays. In one embodiment, leakage inverters 320 are NMOS leakage inverters similar to leakage inverter 210. The AND logic components 310 and 330 can control a signal and drive the signal to a value. An enable signal 303 can be used to "enable" AND control logic components 310 and 330. While the present embodiment of oscillation ring 300 is shown with the same enable signal 303 "enabling" AND logic components 310 and 330, it is appreciated that a different respective enable signal can be used to "enable" each of the AND logic components 310 and 330. Driven inverter 350 switches on and off states in response to a drive signal without impacts associated with a leakage transistor. Ring oscillator 300 has a split 307 in the ring path that forwards an output 304. The state of output 304 is similar to the state of an input to leakage inverter 320.

Figure 4:
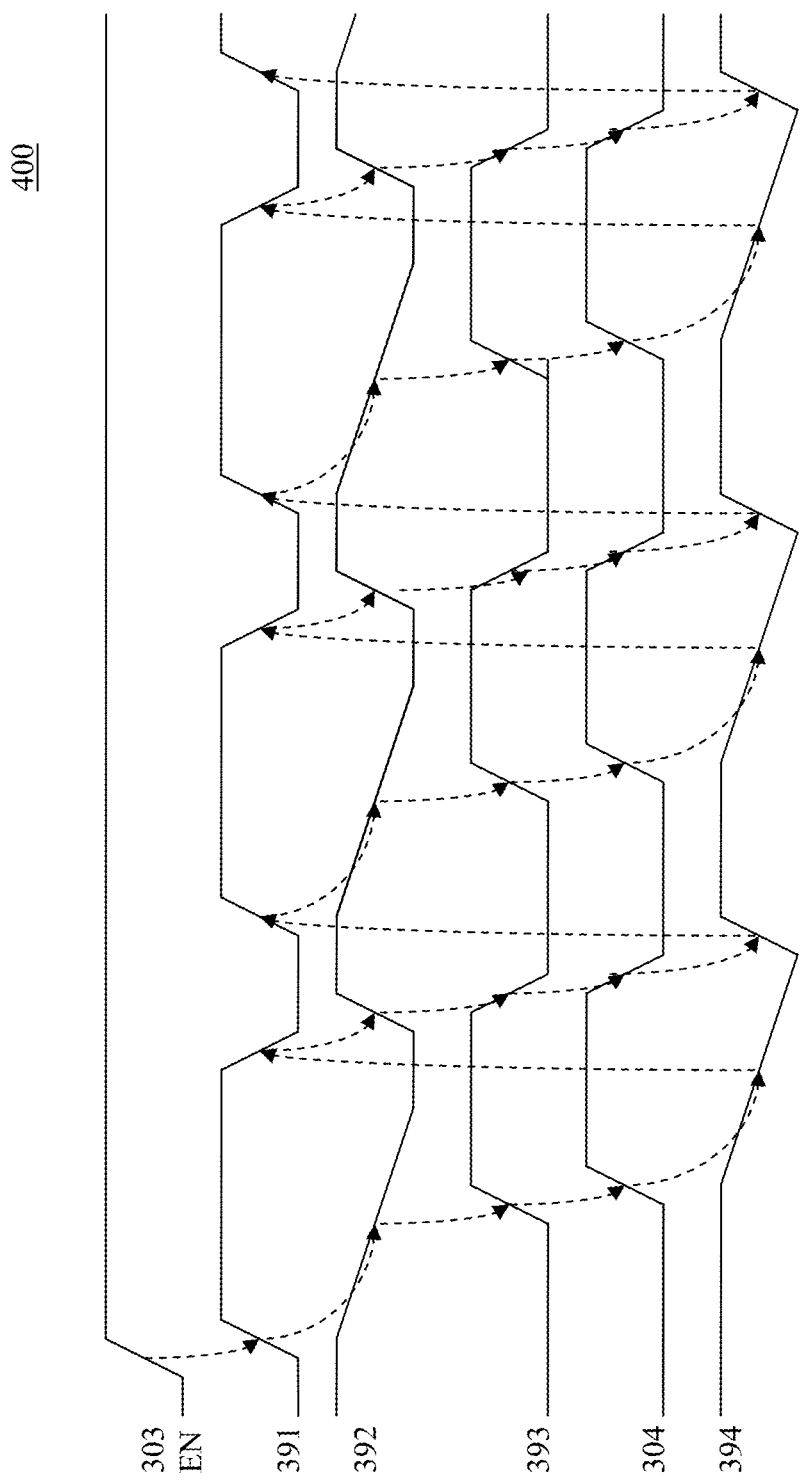
FIG. 4 is a block diagram of an exemplary leakage inversion graph in accordance with one embodiment of the invention.

FIG. 4 is a block diagram of exemplary leakage inversion graph 400 in accordance with one embodiment of the invention. The enable signal 303 is set high to "enable" the flow of information through the AND gates 310 and 320 for an output that mimics the logic value on the other input of the AND gates. In one exemplary implementation, the enabling initiates a transition to a high logic value in a signal at point 391 of the oscillating ring 300. This high logic value at the input of leakage inverter 340 triggers an inverse transition or falling transition to a low logic value at point 392 of an output signal from leakage inverter 340. As shown in the figure, the delay in completing a falling transition in a signal from the leakage inverter 340 is relatively long compared to rising transitions in the signal at point 391. The output at point 393 of a subsequent driven inverter 350 is inverted. The transitions in output signal 304 mimic transitions at point 393 with a slight time shift due to propagation through AND component 310. The output from leakage inverter 320 at point 394 again has relatively slow or long falling transitions and relatively fast or short rising transitions.

Figure 5:
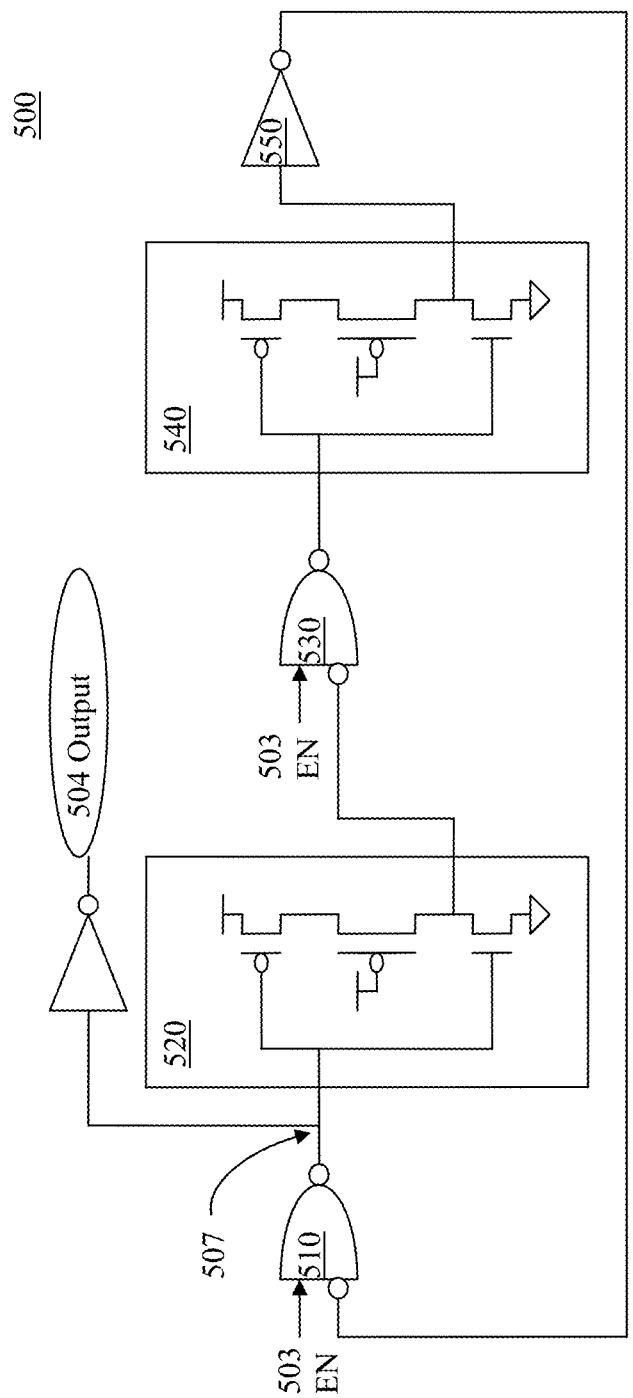
FIG. 5 is a block diagram of another exemplary ring oscillator in accordance with one embodiment of the invention.

FIG. 5 is a block diagram of exemplary ring oscillator 500 in accordance with one embodiment of the invention. Ring oscillator 500 includes leakage inverters 520 and 540, control components 510, 530, and 550. The components are coupled in series in a ring path. Leakage inverters 520 and 540 include PMOS leakage transistors.

The components of ring oscillator 500 cooperatively operate to oscillate a signal. In one embodiment, oscillations include inversions of a signal state. Leakage inverters 520 and 540 oscillate or invert a signal state wherein at least one inversion transition is impacted by a leakage characteristic of a leakage inverter. In one exemplary implementation, the oscillations rising transitions and falling transitions have asymmetric transition delays. In one embodiment, leakage inverters 520 and 540 are PMOS leakage inverters similar to leakage inverter 220. The control components 510 and 530 can control a signal and drive the signal to a value. In one embodiment, control component 510 and 530 respectively include a NAND logic component with a first input coupled to an enable and an inverted second input coupled to the ring path. An enable signal 503 can be used to "enable" NAND control logic components 510 and 530. It is appreciated that a different respective enable signal can be used to "enable" each of the NAND logic components 510 and 530. Control component 550 includes a driven inverter that switches on and off states in response to a drive signal. The driven inverter 550 switches on and off states in response to a drive signal without impacts associated with a leakage transistor. Ring oscillator 500 has a split 507 in the ring path that forwards an output 504. The state of output 504 is similar to the state of an input to leakage inverter 520.

Figure 6:
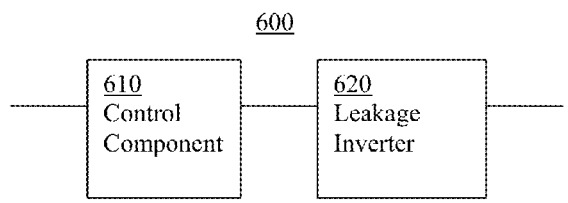
FIG. 6 is a block diagram of an exemplary leakage inverter input control configuration in accordance with one embodiment of the invention.

It is appreciated that a variety of controls can be utilized with the leakage inverters. FIG. 6 is a block diagram of an exemplary leakage inverter input control configuration 600 in accordance with one embodiment of the invention. Leakage inverter input control configuration 600 includes control component 610 and leakage inverter 620. Control component 610 controls the input to leakage inverter 620. It is appreciated that control component 610 can control the input to leakage inverter 620 in a variety of ways. Control component 610 can include a variety of different components (e.g., logic gates, on/off driven inverters, etc.). Control component 610 can control a state (e.g., logical value, high/low voltage, etc.) of an input to leakage inverter 620. Control component 610 can control a timing (e.g., synchronize with other inputs, trigger based upon an enable, etc) of an input to leakage inverter 620.

Figure 7:
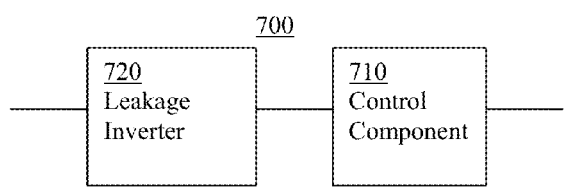
FIG. 7 is a block diagram of an exemplary leakage inverter output control configuration in accordance with one embodiment of the invention.

FIG. 7 is a block diagram of an exemplary leakage inverter output control configuration 700 in accordance with one embodiment of the invention. Leakage inverter output control configuration 700 includes control component 710 and leakage inverter 720. Control component 710 controls the output from leakage inverter 720. It is appreciated that control component 710 can control the output from leakage inverter 720 in a variety of ways. Control component 710 can control a state (e.g., logical value, high/low voltage, etc.) of an output from leakage inverter 720. Control component 710 can control a timing (e.g., synchronize with other outputs, trigger based upon an enable, etc) of an output from leakage inverter 720.

Figure 8:
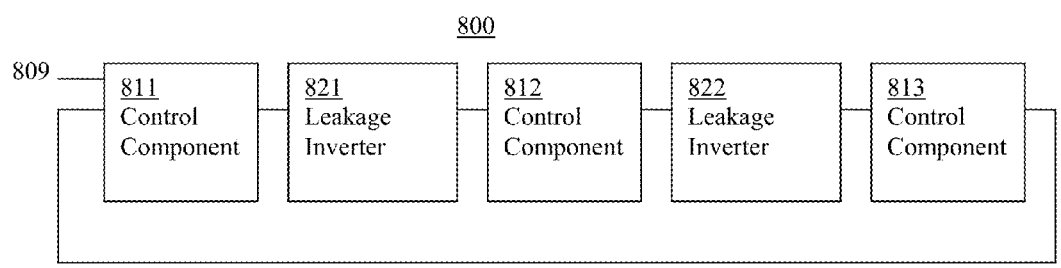
FIG. 8 is a block diagram of an exemplary leakage inverter and control ring configuration in accordance with one embodiment of the invention.

It is appreciated that at least one leakage inverter and control component can be implemented alone or in combination with other control components and leakage inverters. FIG. 8 is a block diagram of an exemplary leakage inverter and control ring configuration 800 in accordance with one embodiment of the invention. Control ring configuration 800 includes control components (e.g., 811, 812 and 813) and leakage inverters (e.g., 821 and 822). Control components 811, 812 and 813 can be utilized to implement a variety of different type of controls (e.g., state determination, timing, etc.). It is appreciated that control components 811, 812 and 813 can receive control inputs (e.g., enables, triggers, etc.) that direct the control. In one embodiment, control component 811 receives control input 809. In one exemplary implementation control components 811 and 812 include logic gates (e.g., similar 310, 330, 510, 530, etc.) and control component 813 includes an on/off driven inverter (e.g., similar to 350, 550, etc.).

It is appreciated that there can be a variety of leakage inversion stages whose delay is driven predominantly by leakage current. In one embodiment, the leakage inversion stage can be a leakage starving stage that is not necessarily inverter. In one embodiment, instead of having just one of the stages gated it can have basically both of them gated. In one exemplary implementation both N and P would be gated with a leakage device. There can be a really tiny generalization as a leakage current starved inverter. There can be a drive inverter and a pass gate that is off, like a tri-state inverter that is off essentially.

It is appreciated that present systems and methods can be implemented in a variety of situations or environments to facilitate a variety of analyses. In one embodiment, a signal transition delay is measured. The transition delay can correspond to a delay from the initiation of an inversion transition to the completion of the inversion transition. The transition delays can be asymmetric and an amount of time to complete a pull up or rising transition can be different from an amount of time to complete a pull down or falling transition (e.g., fast rising transition versus slow falling transition, vise versa, etc.). The measurement can be associated with an isolated or particular transition direction (e.g., measurement of delay associated with a slow falling transition distinct from delay associated with a fast rising transition, vise versa, etc.). The delays can be introduced by a variety of operations (e.g., delay associated with a regular pull up operation versus with waiting for leakage conditions on a pull down operation, delay associated with a pre-charge operation versus a read operation, etc.). The indication of delay measurements can be utilized in a variety of different analysis (e.g., analyze manufacturing process compliance and defects, leakage current power consumption, etc.). The analysis process can include analyzing a fabrication process and operating parameters based upon the amount of delay time associated with a transition. In an embodiment, the analysis process can include determining the temperature at the location(s) of the one or more leakage ring oscillators during operation of a chip that includes the one or more leakage ring oscillators. In one embodiment, a leakage ring oscillator is located in close proximity to a standard ring oscillator, and the analysis process can be utilized to determine the temperature and voltage at the location of the leakage ring oscillator and standard ring oscillator during operation of a chip that includes the leakage ring oscillator and standard ring oscillator. In an embodiment, multiple pairs of a leakage ring oscillator and a standard ring oscillator can be implemented in multiple locations of a die or chip and the analysis process can include determining the temperature and voltage at those multiple locations during the operation of the die or chip.

Figure 9:
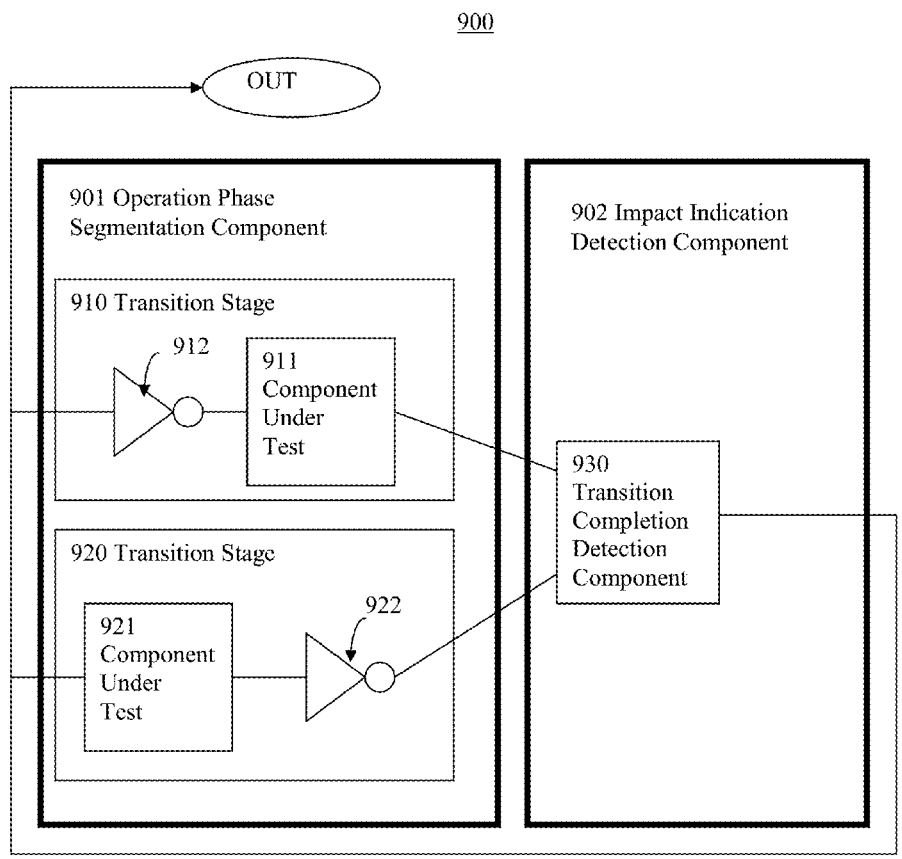
FIG. 9 is a block diagram of an exemplary delay measuring system in accordance with one embodiment of the invention.

FIG. 9 is a block diagram of exemplary delay measuring system 900 in accordance with one embodiment of the invention. Delay measuring system 900 includes a first transition stage 910, a second transition stage 920, and a transition completion detection component 930. In one embodiment, the first transition stage 910 and the second transition stage 920 are parallel to one another and included in a ring configuration with the transition completion detection component 930. The first transition stage 910 includes a first component under test 911 and driven inverter 912 and the first transition stage 910 is operable to cause at least one inversion transition. The second transition stage 920 includes a second component under test 921 and driven inverter 922 and the second transition stage 920 is operable to cause at least one inversion transition. The transition completion detection component 930 is coupled to the first component under test 911 and the second component under test 921. The transition completion detection component 930 is operable to detect an indication of the amount of delay time from initiating an inversion transition to completing the inversion transition. It is appreciated components of exemplary delay measuring system 900 can include a variety of different configurations. Additional different exemplary delay measuring system configurations and components are described in later sections of the present description.

Figure 10:
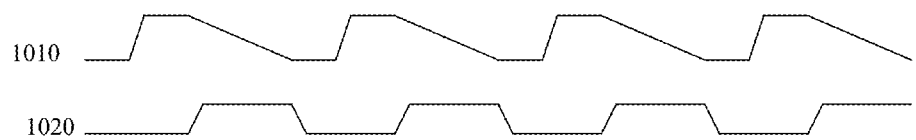
FIG. 10 is a block diagram of an exemplary timing diagram in accordance with one embodiment of the invention.

The indication of the amount of delay time can be based upon the output of the transition completion detection device and can be directed to one aspect (e.g., pull up versus pull down, rising transition versus falling transition, etc.) of an asymmetric delay. In one embodiment, the indication of a transition delay can isolate delays associated with transitions in one direction (e.g., pull up, rising, etc.) from delays associated with transitions in another direction (e.g., pull down, falling, etc.), or vice versa. FIG. 10 is a block diagram of an exemplary timing diagram of a count of slow falling transitions in accordance with one embodiment of the invention. The rising edges of the count signal 1020 are associated with the slow falling transitions of the transition completion detection device output signal 1010. The count of the slow falling transitions can be utilized to determine a slow falling transition delay time or time to complete the slow falling transition. It is appreciated that isolated indication or measurement of a transition delay associated with one transition direction can be utilized to refine examination and analysis of characteristics and features associated with the components under test. Additional description of examination and analysis of characteristics and features associated with the components under test is set forth in later sections.

It is appreciated that a variety of different components can be included in the transition stages and a transition completion detection component. Transitions stage 910 and 920 can include pull up components and pull down components. A component under test can cause a transition itself or impact (e.g., delay, alter, etc.) a transition from another component. The component under test 911 and component under test 921 can be inverters. An inverter can be a leakage inverter and have a transition delay that is primarily a function of the leakage current. The outputs of the transition stages can be inverted whether or not the component under test 911 and component under test 921 themselves invert their respective inputs. In one embodiment, the transition stages can include an inverter with a transition delay that is primarily a function of drive current (e.g., saturation current, on current, etc.).

Figure 11:
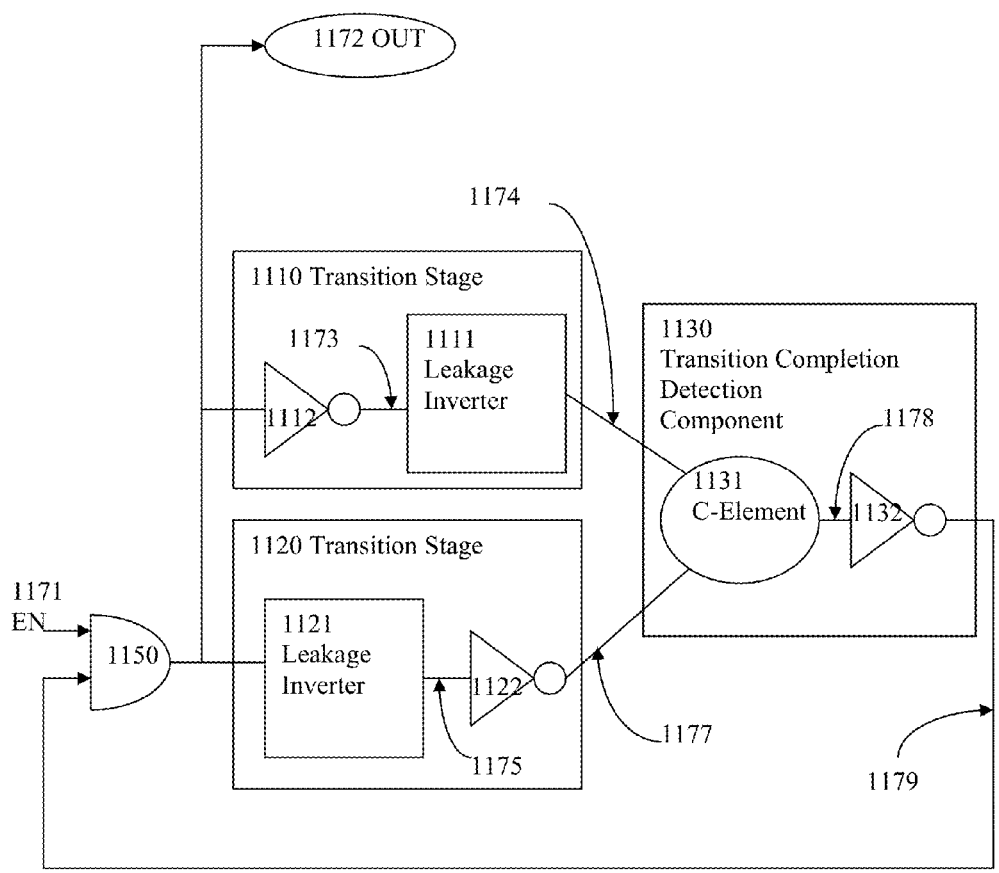
FIG. 11 is a block diagram of exemplary delay measuring system in accordance with one embodiment of the invention.

FIG. 11 is a block diagram of exemplary delay measuring system 1100 in accordance with one embodiment of the invention. The components under test in delay measuring system 1100 are leakage inverters. Delay measuring system 1100 includes first transition stage 1110, second transition stage 1120, transition completion detection component 1130 and control component 1150. Transition stage 1110 includes leakage inverter 1111 and driven inverter 1112. Transition stage 1120 includes leakage inverter 1121 and driven inverter 1122. Transition completion detection component 1130 includes C-Element 1131 and driven inverter 1132.

In one embodiment, leakage inverters 1111 and 1121 are configured to transition a signal, wherein a leakage current impacts a transition of the signal. In one exemplary implementation, the leakage current characteristic impacts a transition delay (e.g., a delay from beginning a transition to completing the transition, etc.). The impact can include delaying the transition. The leakage current characteristic can impact the rising or pull up transition delay or the falling of pull down transition delay. Leakage inverters can be similar to leakage inversion components and systems described in co-pending Applications entitled "A System And Method For Examining Leakage Impacts" (U.S. patent application Ser. No. 13/287,044) and "A System And Method For Examining Asymmetric Operations" (U.S. patent application Ser. No. 13/287,053), both of which are incorporated herein by reference.

Figure 12:
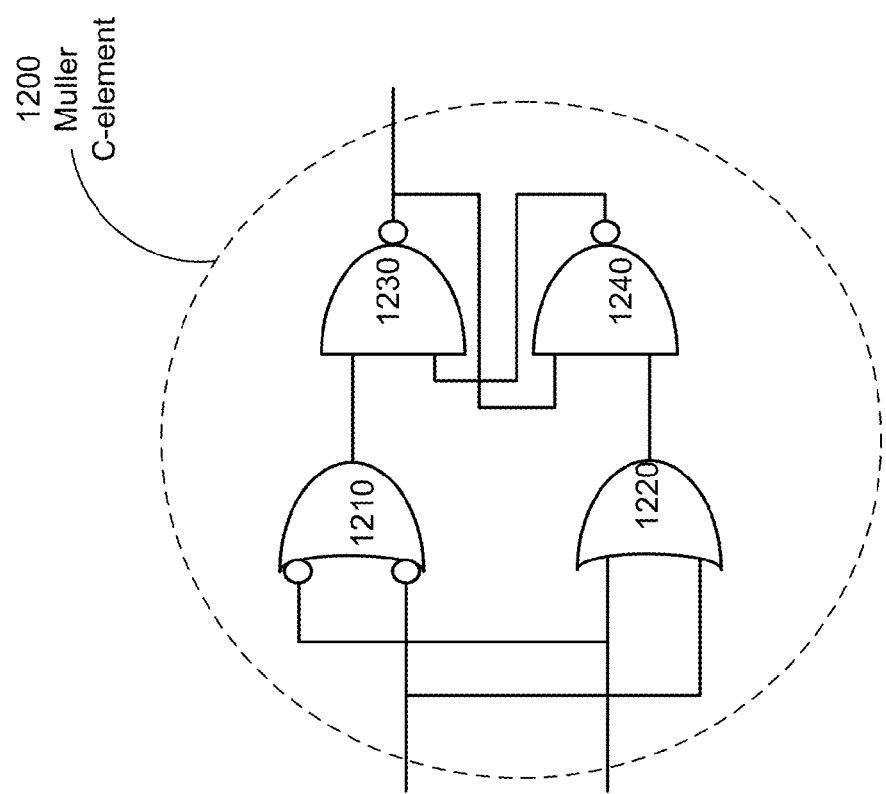
FIG. 12 is a block diagram of an exemplary Muller C-Element in accordance with one embodiment.

FIG. 12 is a block diagram of an exemplary Muller C-Element 1200 in accordance with one embodiment. Muller C-Element 1200 includes NAND logic components 1230 and 1240, OR logic gates 1210 and 1220. The inputs to OR logic gate 1210 are inverted. Muller C-Element 1200 has two inputs and one output. Muller C-Element 1200 is operable: to output a logical 0 if the two inputs are both a logical 0 and continue to output a logical 0 until the two inputs are a logical 1; to output a logical 1 if the two inputs are both a logical 1 and continue to output a logical 1 until the two inputs are a logical 0. The output does not change if: both inputs are a logical 0 and only one of the inputs changes to a logical 1; or both inputs are a logical 1 and only one of the inputs changes to a logical 0.

Figure 13:
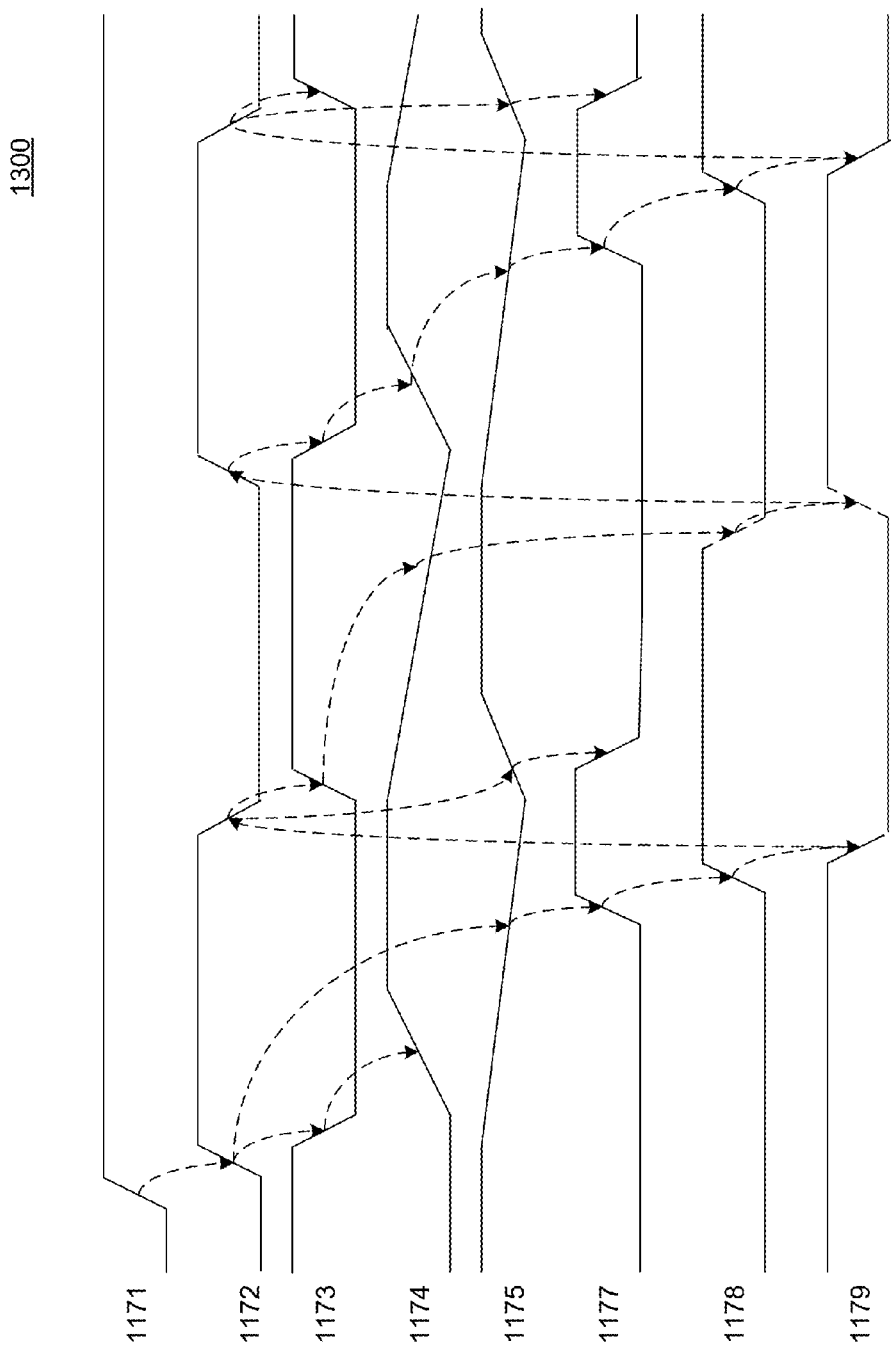
FIG. 13 is a diagram of an exemplary timing graph in accordance with one embodiment of the invention.

FIG. 13 is a diagram of exemplary timing graph 1300 in accordance with one embodiment of the invention. Timing graph 1300 corresponds to one exemplary implementation of delay measuring system 1100 and illustrates respective signal transitions at points 1171, 1172, 1173, 1174, 1175, 1177, 1178 and 1179.

Figure 14:
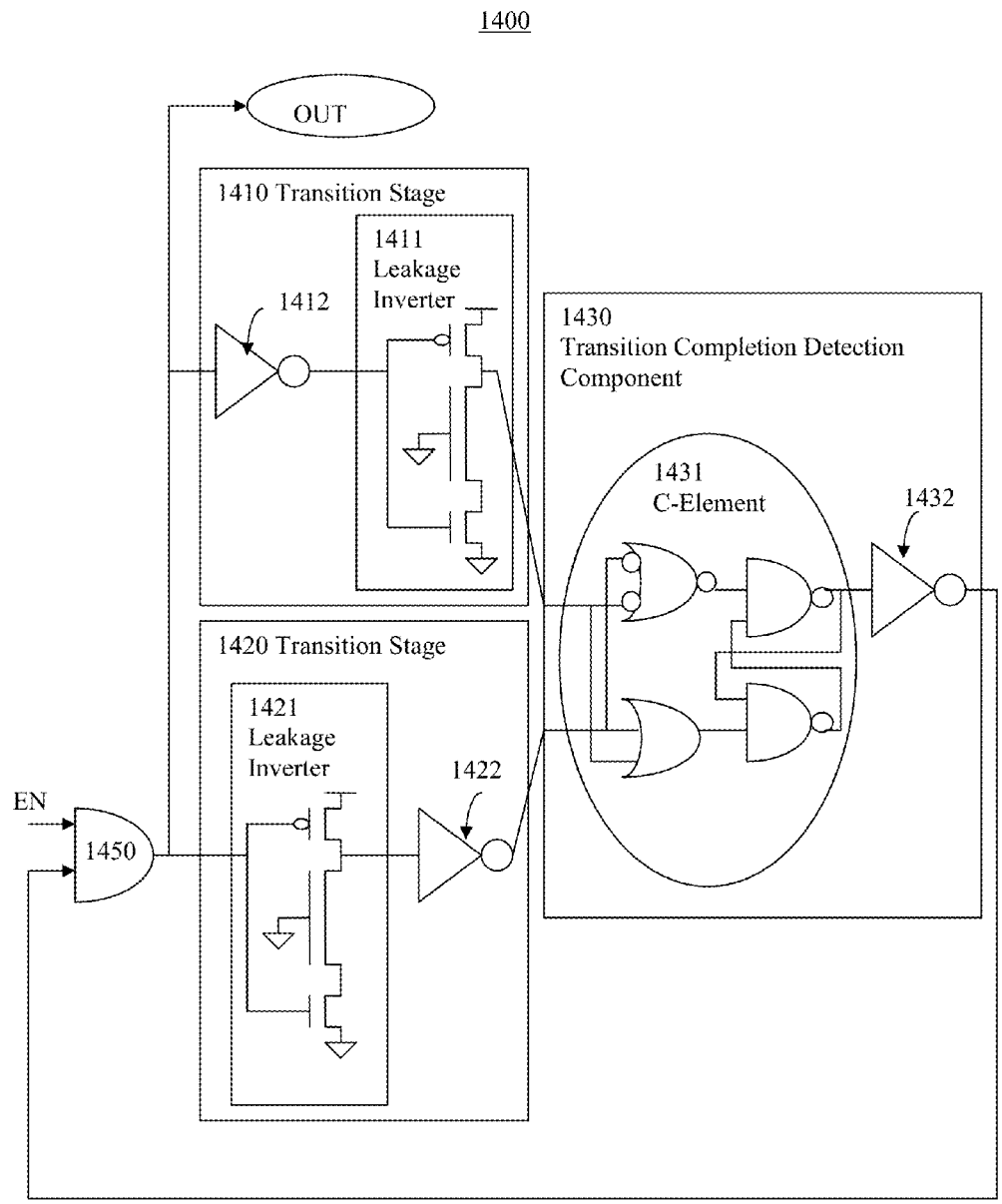
FIG. 14 is a block diagram of exemplary delay measuring system in accordance with one embodiment of the invention.

FIG. 14 is a block diagram of exemplary delay measuring system 1400 in accordance with one embodiment of the invention. The components of delay measuring system 1400 are similar to an embodiment of delay measuring system 1100 when NMOS leakage inverters are the components under test. Delay measuring system 1400 includes first transition stage 1410, second transition stage 1420, transition completion detection component 1430 and control component 1450. Transition stage 1410 includes leakage inverter 1411 and driven inverter 1412. Transition stage 1420 includes leakage inverter 1421 and driven inverter 1422. Transition completion detection component 1430 includes C-Element 1431 and driven inverter 1432. In one embodiment, leakage inverter 1411 and leakage inverter 1421 include NMOS leakage inverters similar to NMOS leakage inverter 1410 and C-Element 1431 includes a C-Element similar to C-Element 1200.

Figure 15:
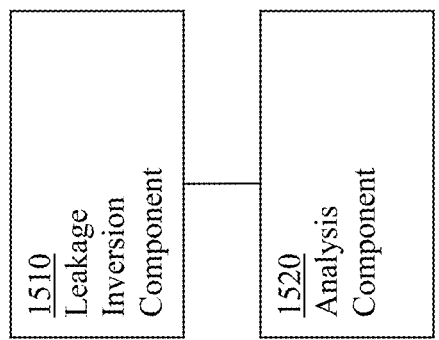
FIG. 15 is a block diagram of exemplary analysis system in accordance with one embodiment of the invention.

FIG. 15 is a block diagram of exemplary analysis system 1500 in accordance with one embodiment of the invention. Analysis system 1500 includes leakage inversion component 1510 and analysis component 1520. It is appreciated that the leakage inversion component 1510 can include a variety of leakage inversion implementations. Leakage inversion component 1510 can include at least one leakage inverter (e.g., 100, 210, 220, etc.). Leakage inversion component 1510 can include at least one control component (e.g., 310, 510, 610, 710, etc.). It is also appreciated that analysis component 1520 can include a variety of implementations. The analysis component 1520 can include components on chip with the leakage inversion component, components off chip from the leakage inversion component, combination of components on and off chip. It is also appreciated that the analysis component 1520 can perform a variety of different analysis. In one exemplary implementation, the analysis can include transition delays, determination of leakage power consumption, manufacturing process compliance and defects, etc.

Figure 16:
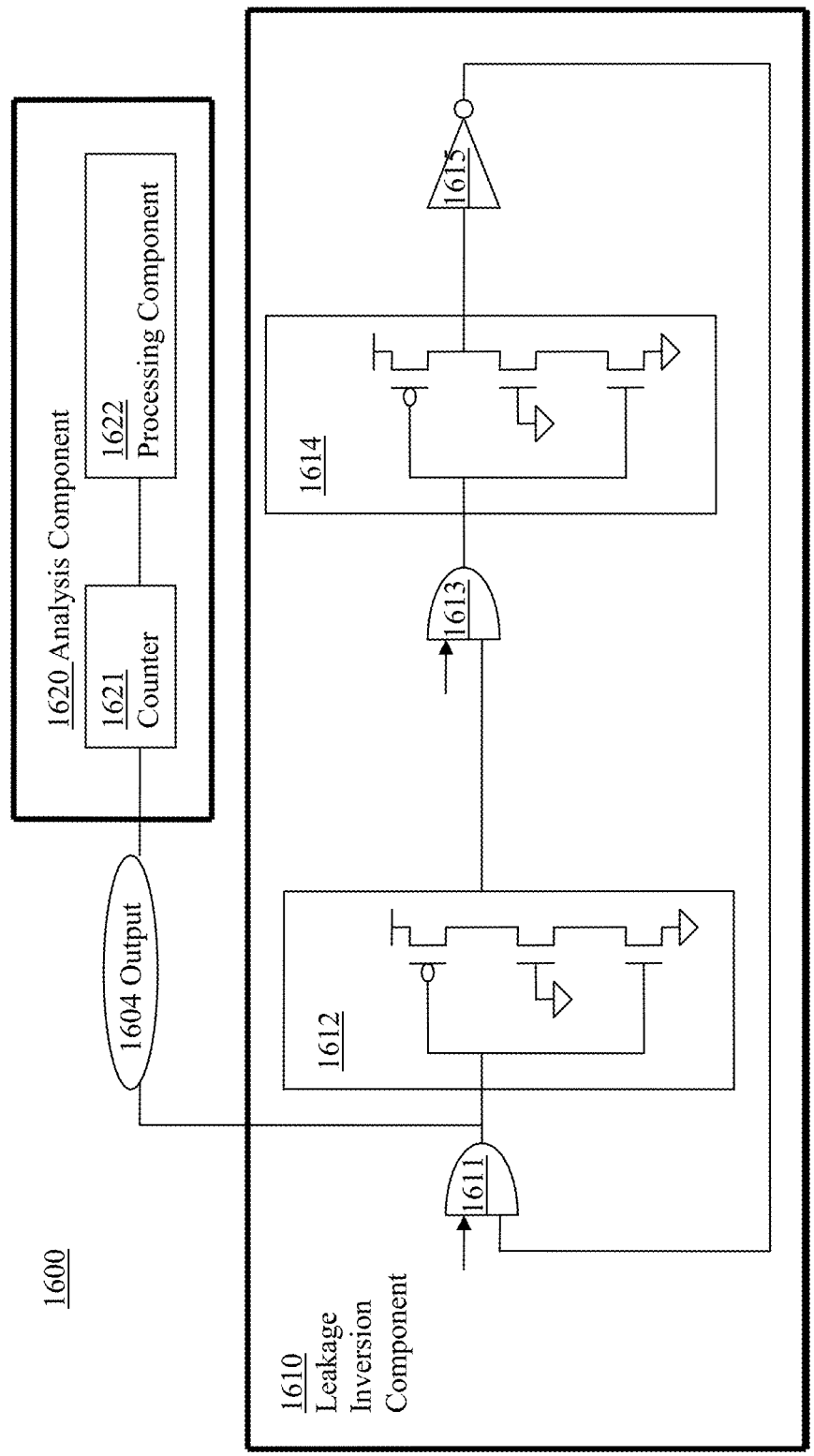
FIG. 16 is a block diagram of exemplary analysis system in accordance with one embodiment of the invention.

FIG. 16 is a block diagram of exemplary analysis system 1600 in accordance with one embodiment of the invention. Analysis system 1600 includes leakage inversion component 1610 and analysis component 1620. Leakage inversion component 1610 includes a leakage oscillating ring comprising AND gates 1611 and 1613, leakage inverters 1612 and 1614, and on/off driven inverter 1615 coupled in a ring path. Output 1604 is forwarded from leakage inversion component 1610 to analysis component 1620. Analysis component 1620 includes counter 1621 and processing component 1622.

Figure 17:
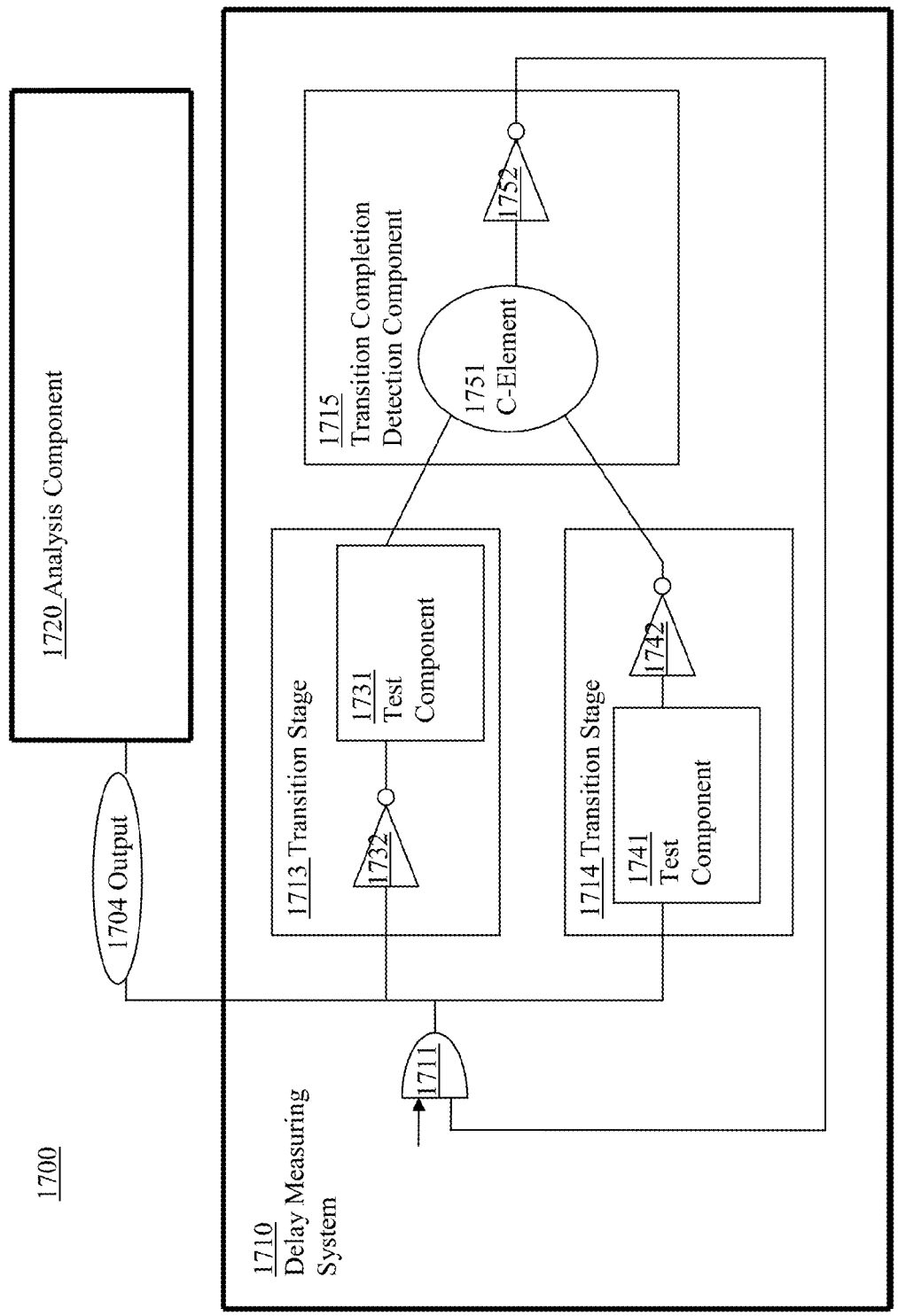
FIG. 17 is a block diagram of exemplary analysis system in accordance with one embodiment of the invention.

FIG. 17 is a block diagram of exemplary analysis system 1700 in accordance with one embodiment of the invention. Analysis system 1700 includes delay measuring component or system 1710 and analysis component 1720. Delay measuring system 1710 includes a first transition stage 1713, a second transition stage 1714, a transition completion detection component 1715 and control component 1711. The first transition stage 1713 includes a first component under test 1731 and driven inverter 1732. The second transition stage 1714 includes a second component under test 1741 and driven inverter 1742. Transition completion detection component 1715 includes C-element 1751 and driven inverter 1752. The components of delay measuring system 1710 are similar to components of delay measuring system 900. Analysis component 1720 performs analysis based upon the output 1704 from delay measuring system 1710. In one embodiment analysis component 1720 performs an analysis process similar to an analysis process of block 1820.

In one embodiment, while an indication of leakage current is measured an analysis is directed to other aspects beyond leakage current. In one exemplary implementation, the analysis is more concerned with a related but different characteristic. The concern or examination can be directed to what the static power consumption of the device is. It is appreciated there is a lot of analysis that can be done while examining the delay in the frequency. In one embodiment, component configurations and operations are simulated in spice and then compared to the measured result with present systems. If the physical implementation is running faster than the simulated version then there is an indication the leakage is higher than expected. In one embodiment, the difference between the PMOS and NMOS leakage is analyzed. This is similar to asymmetric situations. One thing that was previously extremely challenging in terms of ring oscillator is how to figure out how much of a characteristic (e.g., delay, power consumption, etc.) is associated with or attributable to NMOS components and how much is associated with or attributable to PMOS components.

It is appreciated that present systems and methods can be implemented in a variety of situations or environments. Present systems and methods can facilitate confirmation of chip compliance with design specifications and detection of manufacturing process irregularities. Present systems and methods can facilitate examination and analysis of asymmetric characteristics. The output of present systems can include a waveform that is acceptable to a counter. In one embodiment, there is a 50% duty cycle output similar to a clock, with frequency and duty cycle both determined by a slow transition, which can be used to drive a counter. In one embodiment, a frequency and duty cycle can be determined by a fast transition. In one exemplary implementation, the present operation examination approaches facilitate utilization of relatively small ring oscillations with asymmetric delay devices that achieve proper polarities. The present approaches can also allow for measurement and analysis components (e.g., components of systems 100, 300, 800, 1300, etc.) to be selectively turned on and off facilitating further conservation of power consumption. The present approaches facilitate more monitoring structures to be instantiated than conventional attempts and at a lower area cost. The present approaches also facilitate closer monitoring of process and operating parameters. In an embodiment, present systems and methods can facilitate determining the temperature at the location(s) of the one or more leakage ring oscillators during operation of a chip that includes the one or more leakage ring oscillators. In one embodiment, present systems and methods can facilitate determining the temperature and voltage at the location of a leakage ring oscillator and a standard ring oscillator during operation of a chip that includes the leakage ring oscillator and standard ring oscillator. In an embodiment, multiple pairs of a leakage ring oscillator and a standard ring oscillator can be implemented in multiple locations of a die or chip and present systems and methods can facilitate determining the temperature and voltage at those multiple locations during the operation of the die or chip.

FIG. 18 is a flow chart of exemplary analysis method 1800 in accordance with one embodiment of the invention.

In block 1810, a leakage inversion process is performed. In one embodiment, the leakage inversion process includes pull ups and pull downs wherein at least one transition is impacted by leakage characteristics. In one exemplary implementation, the leakage inversion process includes transitions between a logical 1 state to a logical 0 state.

In block 1820, an analysis process is performed based upon the leakage inversion process. It is appreciated that a variety of different analysis can be performed. In one embodiment, transitions delays are utilized in determining a frequency and the frequency can be converted back to an indication of a leakage current determination. In one exemplary implementation, the leakage inverter gate capacitance is known and an RC (resistance/capacitance) delay can be utilized to determine the current. In one exemplary implementation, a frequency division or adjustment can be a function of the number of inverters in the ring. In one embodiment the frequency can be utilized for determining the temperature at the locations of the ring oscillator during operation of a chip. In one embodiment the frequency can be utilized for determining the temperature and voltage at the location of the leakage and standard ring oscillators during operation of a chip that includes these two types of ring oscillators.

In one embodiment results from a ring oscillator including a leakage inverter are compared to a spice simulation of the circuit. If the actual physical implementation is running faster then it is an indication the leakage is higher than expected. In an embodiment, results from a ring oscillator including a leakage inverter can be utilized to determine the temperature at the locations of the ring oscillator during operation of a chip that includes the ring oscillator. In one embodiment, a ring oscillator including a leakage inverter (leakage ring oscillator) is located in close proximity to a standard ring oscillator, and results from the leakage ring oscillator and results from the standard ring oscillator can be utilized together to determine the temperature and voltage at the location of the leakage ring oscillator and standard ring oscillator during operation of a chip that includes the leakage ring oscillator and standard ring oscillator. In an embodiment, multiple pairs of a ring oscillator including a leakage inverter (leakage ring oscillator) and a standard ring oscillator can be implemented in multiple locations of a die or chip to determine the temperature and voltage at those multiple locations during the operation of the die or chip.

In one embodiment, a simulation is performed in which the device under test or leakage inverts is replaced with a current source in the simulation and currents that is put in the source is swept through various values. In one exemplary implementation, the values are swept until the frequency matches what is being measured and that can be utilized as an indication of what the current is on those leakage devices.

In one exemplary implementation, characteristics of a leakage inverter on silicon is compared to a simulated ideal current source. In one exemplary implementation, the output of the simulated current source is charted or graphed versus frequency and if the current is high then frequency is high. The graph can be used to compare a measured frequency of a leakage inversion component to an ideal graph simulation. The simulation graph can be utilized to do the correlation between frequency and current.

FIG. 19 is a flow chart of exemplary leakage inversion process 1900 in accordance with one embodiment of the invention. In one embodiment, leakage inversion process 1900 is similar to the leakage inversion process of block 1810.

In block 1910, a signal in a first state is received. The signal can be a first logical state signal (e.g., a characteristic of the signal corresponds to a first logical state, etc.). In one embodiment, the first logic state signal can correspond to a logical 1. In another embodiment, the first logic state signal can correspond to a logical 0. In one exemplary implementation, the first logic state signal can correspond to a pulled up or high voltage signal. In another exemplary implementation, the first logic state signal can correspond to a pulled down or low voltage signal.

In block 1920, a characteristic of at least one component is changed. In one embodiment, the component is a transistor and a characteristic of the at least one transistor is changed. The transistor can be a pull up transistor or a pull down transistor. Changing the characteristic of the transistor can turn the transistor on or off. In one embodiment, a voltage value at a gate of the transistor and a characteristic (e.g., resistance of a channel, etc.) is changed to turn on or off the transistor. In one exemplary implementation, the change in the component inverts the logical value of a signal.

In block 1930, a signal in a second state is output, wherein a delay between receiving the first logical state signal and outputting the second logical state signal is impacted by a leakage current. The signal can be a second logic state signal. In one embodiment, the second logic state is the opposite or inverse of the first logic state. In one exemplary implementation, the first logical state is a logical 1 and the second logical state is a logical 0. In another exemplary implementation, the first logical state is a logical 0 and the second logical state is a logical 1. In one embodiment, a leakage current increases or makes the delay longer than would otherwise take if the leakage current was not impacting the transition.

FIG. 20 is a flow chart of exemplary analysis process 2000 in accordance with one embodiment of the invention. In one embodiment, analysis process 2000 is similar to the analysis process of block 1820.

In block 2010, an indication associated with a leakage characteristic is received. In one embodiment, the indication includes transitions in a signal in which at least one transition delay is impacted by a leakage characteristic.

In block 2020, a transition delay time is determined, wherein the transition delay time is impacted by a leakage characteristic.

In block 2030, characteristics of a device are analyzed based upon the transition delay time. It is appreciated that a variety of characteristics can be analyzed. In an embodiment, output(s) from one or more leakage ring oscillators can be utilized to determine the temperature at the location(s) of the one or more leakage ring oscillators during operation of a chip that includes the one or more leakage ring oscillators. In one embodiment, a leakage ring oscillator is located in close proximity to a standard ring oscillator, and output from the leakage ring oscillator and output from the standard ring oscillator can be utilized together to determine the temperature and voltage at the location of the leakage ring oscillator and standard ring oscillator during operation of a chip that includes the leakage ring oscillator and standard ring oscillator. In an embodiment, multiple pairs of a leakage ring oscillator and a standard ring oscillator can be implemented in multiple locations of a die or chip to determine the temperature and voltage at those multiple locations during the operation of the die or chip.

Figure 21:
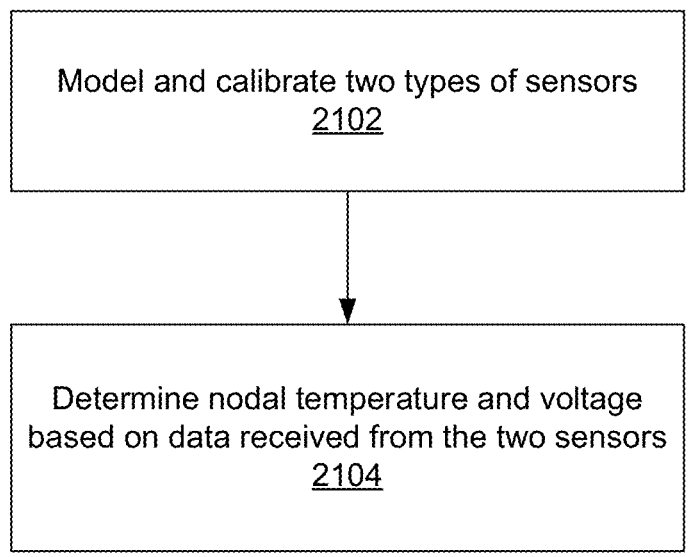
FIG. 21 is flow diagram of a method in accordance with various embodiments of the invention.

FIG. 21 is a flow diagram of a method 2100 in accordance with various embodiments of the invention for determining temperature and voltage at a location of a die or semiconductor device. Although specific operations are disclosed in FIG. 21, such operations are examples. The method 2100 may not include all of the operations illustrated by FIG. 21. Also, method 2100 may include various other operations and/or variations of the operations shown. Likewise, the sequence of the operations of flow diagram 2100 can be modified. It is appreciated that not all of the operations in flow diagram 2100 may be performed. In various embodiments, one or more of the operations of method 2100 can be performed by software, by firmware, by hardware or by any combination thereof, but is not limited to such. Method 2100 can include processes of embodiments of the invention which can be performed by a processor(s) and electrical components under the control of computer or computing device readable and executable instructions (or code). The computer or computing device readable and executable instructions (or code) may reside, for example, in data storage features such as computer or computing device usable volatile memory, computer or computing device usable non-volatile memory, and/or computer or computing device usable mass data storage. However, the computer or computing device readable and executable instructions (or code) may reside in any type of computer or computing device readable medium or memory.

In an embodiment, method 2100 can be used to determine accurate temperature and voltage at each sensor location on a die or semiconductor device while the chip is functioning. Thus, under almost any workload, time-varying thermal and voltage-droop heat-maps of the die can be created. Therefore, this information can be used to observe the hot-spot migration as well as static voltage droops on the die. In addition, note that such information can be utilized for numerous applications such as (but not limited to): implementation of efficient thermal solutions, accurate PVT (process, voltage, and temperature) evaluations, device reliability study, and the like. It is pointed out that method 2100 (in one embodiment) is immune to voltage noise and actually computes or determines the voltage at each sensor location. In accordance with various embodiments, method 2100 can be implemented as part of an analysis component (e.g., 1520, 1620, and/or 1720) as described herein, but is not limited to such.

Within method 2100, two types of sensors can be modeled as functions of temperature and voltage as independent variables. In an embodiment, these functions are used to compute the temperature (and voltage) using the frequency value of the corresponding sensor (e.g., ring oscillator). Using this technique, the nodal temperature and voltage can be determined based on data received from the two sensors. In this manner, method 2100 can be used to determine accurate temperature and voltage at each sensor location on a die or semiconductor device while the chip is functioning.

At operation 2102 of FIG. 21, two types of sensors can be modeled as functions of temperature and voltage as independent variables. In one embodiment, the modeling can involve the characterization of each sensor under a range of stabilized temperature and voltage conditions while a die or chip is operating. It is pointed out that operation 2102 can be implemented in a wide variety of ways.

For example in an embodiment, at operation 2102 the two types of sensors can be placed in close proximity to each other as part of a die or semiconductor device (e.g., graphics processor unit (GPU), central processor unit (CPU), processor, microprocessor, and the like). In one embodiment, note that the two sensors do not need to be right next to each other to be in close proximity. In one embodiment, at operation 2102 one of the sensors can be implemented as a ring oscillator that is sensitive to temperature while the other sensor can be implemented as a ring oscillator that is sensitive to voltage. For example in an embodiment, the temperature sensitive ring oscillator can be implemented with a leakage ring oscillator (e.g., 100, 300, or 500) composed of specialized current-starved inverters while the voltage sensitive ring oscillator (e.g., 2400 of FIG. 24) can be implemented with a ring-oscillator composed of minimum sized inverters, but are not limited to such. In an embodiment, it is pointed out that the voltage sensitive ring oscillator can be implemented with a generic (or standard or normal or non-leakage) ring oscillator with an odd number of inverters. Note that in one embodiment, both the ring-oscillators may be sensitive to temperature as well as voltage, but their relative sensitivity to temperature and voltage is orthogonal in nature. For example in an embodiment, the leakage ring-oscillator can be very sensitive to temperature and less sensitive to voltage while the other ring-oscillator can be very sensitive to voltage and less sensitive to temperature.

It is noted that in one embodiment, at operation 2102 of FIG. 21, the larger the difference in temperature sensitivity and voltage sensitivity between the two ring oscillators, process 2100 can produce a more accurate result with a lesser number of iterations. It is pointed out that in one embodiment a temperature sensitive sensor and a voltage sensitive sensor can be implemented as a leakage ring oscillator and a standard ring oscillator, respectively. As such, when there is a change in voltage for both ring oscillators, the frequency of the standard ring oscillator will exhibit a more dramatic change than the frequency of the leakage ring oscillator. Furthermore, when there is a change in temperature for both ring oscillators, the frequency of the leakage ring oscillator will exhibit a more dramatic change than the frequency of the standard ring oscillator.

In an embodiment at operation 2102, characterization can be performed of the leakage ring oscillator (e.g., 100, 300, or 500) and the standard ring oscillator (e.g., 2400) under a range of stabilized temperature and voltage conditions. For example in an embodiment, as part of the characterization, a chip or die is set to a known temperature (e.g., 25° C.) and the voltage is set to a known value (e.g., 0.9 V). Then the count (or frequency) is determined of both the leakage ring oscillator and the standard ring oscillator under these conditions. Once the count for each is measured, that data can be stored by memory in association with the known temperature, voltage, and corresponding ring oscillator. After that, the voltage for the chip or die can be set to another known value (e.g., 1.0 V) while keeping the temperature set at the previous value (e.g., 25° C.). Then the count (or frequency) is determined of both the leakage ring oscillator and the standard ring oscillator under these changed conditions. Once the count for each is measured, that data can be stored by memory in association with the known temperature, voltage, and corresponding ring oscillator. This process can be repeated for different voltage values. Once all the desired voltage values are done at the established (or known) temperature, then the temperature can be changed to a different value (e.g., 35° C.). Once the new temperature value is established, all the desired voltage values can be set, and then the count (or frequency) is determined of both the leakage ring oscillator and the standard ring oscillator under these conditions. All these conditions and counts can be stored by memory in association with the particular ring oscillator. Note that in one embodiment this process can be performed for a desired range of temperature values in gradual steps (e.g., 25° C., 35° C., 45° C., 55° C., 65° C., . . . 105° C.) and a desired range of voltage values in gradual steps (e.g., 0.9 V, 1.0 V, . . . 1.2 V). In this manner, in an embodiment, at a known temperature and known voltage, the predicted count (or frequency) of the leakage ring oscillator and the predicted count (or frequency) of the standard ring oscillator are known. In addition, a count (or frequency) value of the leakage ring oscillator can be associated with a known temperature and/or known voltage. Furthermore, a count (or frequency) value of the standard ring oscillator can be associated with a known temperature and/or known voltage. It is noted that operation 2102 can be implemented in any manner similar to that described herein, but is not limited to such.

At operation 2104 of FIG. 21, a nodal temperature and voltage can be determined based on data received from the two sensors. It is noted that operation 2104 can be implemented in a wide variety of ways. For example in an embodiment, a cross-coupled model can be utilized at operation 2104 that uses data received from the two sensors and iteratively converges to actual node temperature and voltage. In one embodiment, at operation 2104, iterative solving of bivariate equations (each representing a sensor) can be performed to derive or determine nodal temperature and voltage.

It is noted that in an embodiment, at operation 2104, a global trigger mechanism implemented on chip can be utilized to trigger all the sensors (e.g., the two ring oscillators) at about or substantially the same time (or at the same time) during a functional test. In one embodiment, all sensors (e.g., the two ring oscillators) can be configured to run for the exact same duration (or substantially similar duration) when triggered. Note that while the semiconductor chip is running a functional test in an embodiment, each of the counts of the ring-oscillators are read out at operation 2104 and translated to frequency values. In an embodiment, a circuit can be implemented that performs measurements across an entire chip or die by starting and stopping all of the sensors at approximately or substantially the same time (or at the same time).

Figure 22:
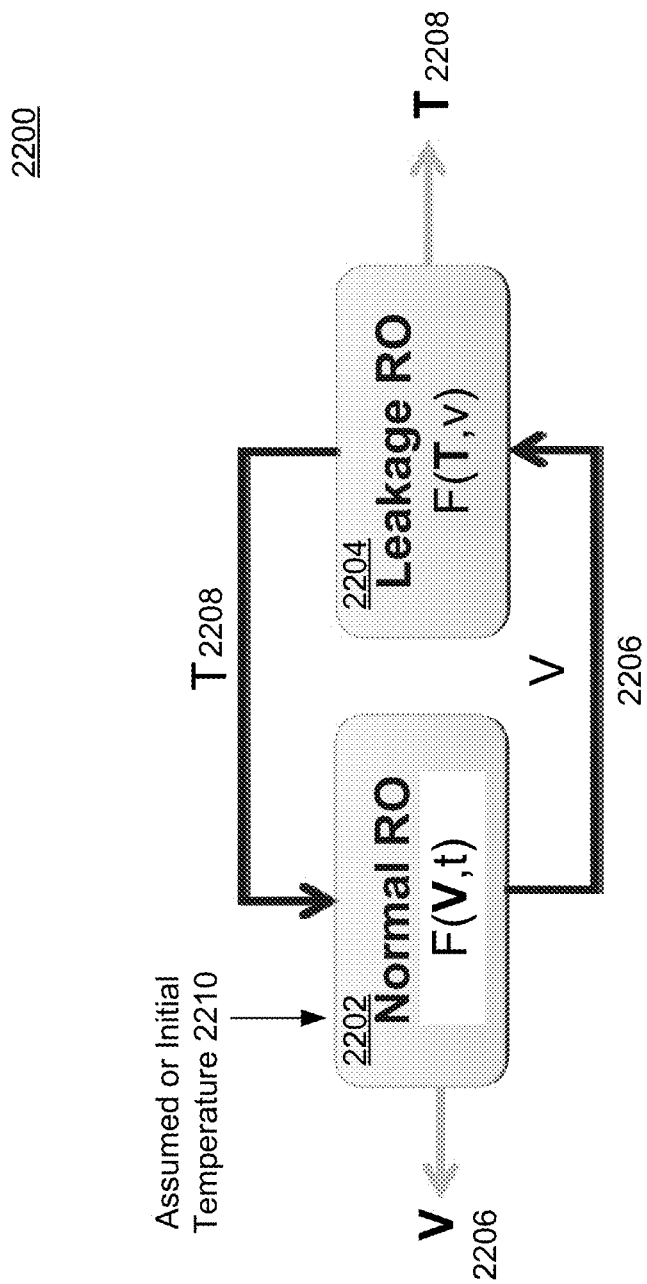
FIG. 22 is a block diagram of iterative solving of bivariate equations to derive nodal temperature and voltage in accordance with an embodiment of the invention.

For example, FIG. 22 is a block diagram 2200 of iterative solving of bivariate equations (each representing a sensor) to derive nodal temperature and voltage in accordance with an embodiment of the invention. FIGS. 21 and 22 are described in combination in order to provide a better understanding of operation 2104. Note that within FIG. 22, a normal ring oscillator (RO) function or model 2202 and a leakage ring oscillator (RO) function or model 2204 can be implemented in a wide variety of ways. For example in one embodiment, the leakage ring oscillator (RO) function or model 2204 can be represented by the following equation L:

$$L_{RO} = f_L(T,v) = a_0 + a_1 T + a_2 v + a_3 Tv + a_4 T^2 + a_5 v^2 + a_6 T^2 v + a_7 Tv^2$$

and the normal (or standard) ring oscillator (RO) function or model 2202 can be represented by the following equation $S_{RO}$:

$$S_{RO} = f_N(V,t) = a_0 + a_1 t + a_2 V + a_3 tV + a_4 t^2 + a_5 V^2 + a_6 t^2 V + a_7 tV^2$$

In another embodiment, the leakage ring oscillator (RO) function or model 2204 can be represented by the following equation L:

$$L_{RO} = f_L(T,v) = A_0 T + A_1 v + A_2 T^2 + A_3 V^2 + A_4 Tv \ldots$$

and the normal (or standard) ring oscillator (RO) function or model 2202 can be represented by the following equation $S_{RO}$:

$$S_{RO} = f_N(V,t) = A_0 t + A_1 V + A_2 t^2 + A_3 V^2 + A_4 tV \ldots$$

It is pointed out that a wide variety of functions or formulas or equations can be utilized to model the normal ring oscillator (RO) function or model 2202 and a leakage ring oscillator (RO) function or model 2204. For example, in one embodiment, anything can be utilized that best models the collected data (e.g., any surface function that best fits that model with the least error). In an embodiment, a regression analysis can be utilized for the normal ring oscillator (RO) function or model 2202 and a leakage ring oscillator (RO) function or model 2204.

In one embodiment, at operation 2104, it can be assumed that all the nodes are at room temperature (e.g., initial condition T=25° C.) and this value 2210 can be entered into the normal ring oscillator (RO) function or model 2202. As such, at operation 2104, the standard ring oscillator model 2202 can convert the measured frequency and temperature into voltage 2206. In an embodiment, at operation 2104, the computed voltage 2206 forms an input to the leakage ring oscillator (RO) model 2204, which converts the measured frequency and voltage into temperature 2208. In one embodiment, this process can be repeated at operation 2104 until the computed or determined temperature 2208 and voltage 2206 converge to a static value (e.g., 0 delta between iterations), but is not limited to such. In another embodiment, this process can be repeated at operation 2104 for a finite number of iterations to computed or determine temperature 2208 and voltage 2206, but is not limited to such. In one embodiment, note that the determined temperature 2208 and voltage 2206 have their own importance since people will look at static voltage droop as well as temperature in some applications. In addition, for temperature the application being what is the hottest spot on the die or chip because you can locate so many of these (e.g., a pair of a standard ring oscillator and a leakage ring oscillator) on a die or chip because of their small size.

In an embodiment, operation 2104 can be implemented as a system test of a die or chip or semiconductor device, but is not limited to such. For example in an embodiment, the system test can include running any application (e.g., game, program, and the like) on the die or chip or semiconductor device at operation 2104, and then determining the hottest spot or area in the die or chip or semiconductor device. In addition, that determined information can be utilized to enable or trigger one or more cooling solutions for the die or chip or semiconductor device. In this manner, operation 2104 enables accurately predicting or determining the temperature at any location in the chip (or die or semiconductor device) when it is doing any function. Operation 2104 can be implemented in any manner similar to that described herein, but is not limited to such.

In one embodiment, it is noted that method 2100 of FIG. 21 can be implemented to operate with any number of sensor pairs that include a temperature sensitive sensor and a voltage sensitive sensor. In an embodiment, it is pointed out that when a temperature sensitive sensor and a voltage sensitive sensor are implemented as a leakage ring oscillator and a standard ring oscillator, respectively, they have the benefit of being small in size thereby enabling them to be implemented in multiple locations of a chip, die, or semiconductor device. In one embodiment, note that since the total area of a leakage ring oscillator and counter (involved in digitally measuring the frequency) in combination with a standard ring oscillator and counter (involved in digitally measuring the frequency) is multiple times smaller than the size of the thermal diode circuitry, it can be inexpensively distributed across a die or chip. Note that better understanding of chip circuitry behavior and more accurate sensing capabilities across the die or chip can enable cheaper and more efficient thermal solutions along with creating time-varying thermal and voltage-droop heat-maps of the die or chip.

Figure 23:
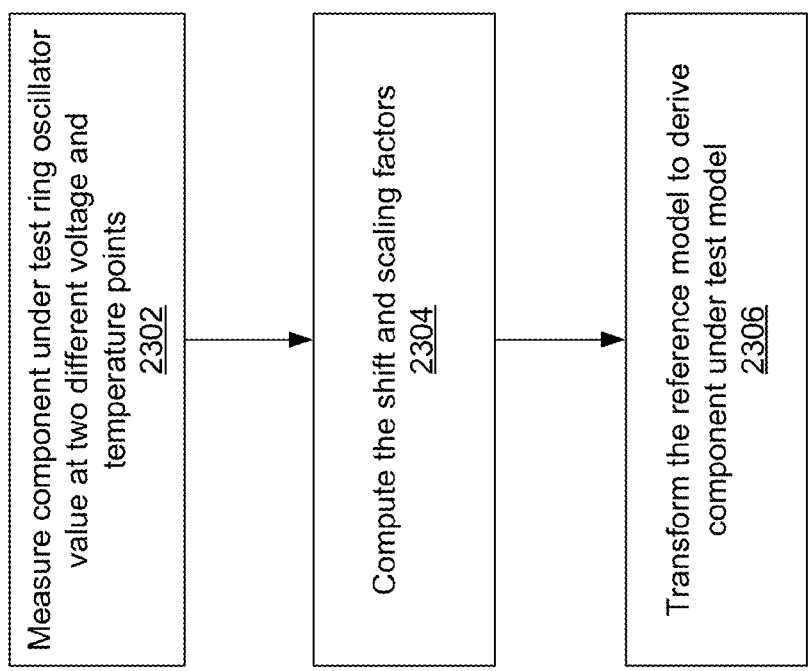
FIG. 23 is a flow diagram of a method in accordance with various embodiments of the invention for calibrating for intra-die process variations (PV).

FIG. 23 is a flow diagram of a method 2300 in accordance with various embodiments of the invention for calibrating for intra-die process variations (PV). Although specific operations are disclosed in FIG. 23, such operations are examples. The method 2300 may not include all of the operations illustrated by FIG. 23. Also, method 2300 may include various other operations and/or variations of the operations shown. Likewise, the sequence of the operations of flow diagram 2300 can be modified. It is appreciated that not all of the operations in flow diagram 2300 may be performed. In various embodiments, one or more of the operations of method 2300 can be performed by software, by firmware, by hardware or by any combination thereof, but is not limited to such. Method 2300 can include processes of embodiments of the invention which can be performed by a processor(s) and electrical components under the control of computer or computing device readable and executable instructions (or code). The computer or computing device readable and executable instructions (or code) may reside, for example, in data storage features such as computer or computing device usable volatile memory, computer or computing device usable non-volatile memory, and/or computer or computing device usable mass data storage. However, the computer or computing device readable and executable instructions (or code) may reside in any type of computer or computing device readable medium or memory.

At operation 2302, a component under test (CUT) ring oscillator (RO) value can be measured at two different voltage and temperature (v,t) points. It is pointed out that operation 2302 can be implemented in a wide variety of ways. For example in an embodiment, the measured CUT RO value at operation 2302 can be a count output by the CUT RO after a defined time period or duration. In one embodiment, at operation 2302, a first measured value (or count) of the CUT RO at a first temperature (t1) and first voltage (v1) can be represented by CUT1 while a second measured value (or count) of the CUT RO at a second temperature (t2) and second voltage (v2) can be represented by CUT2. In addition, at operation 2302, a first reference value (or count) derived from a model at the first temperature (t1) and the first voltage (v1) can be represented by REF1 while a second reference value (or count) derived from the model at the second temperature (t2) and the second voltage (v2) can be represented by REF2. Note that operation 2302 can be implemented in any manner similar to that described herein, but is not limited to such.

At operation 2304 of FIG. 23, the shift and scaling factors can be computed or determined. It is noted that operation 2304 can be implemented in a wide variety of ways. For example in one embodiment, the shift (b) and scaling factors (m) can be computed or determined utilizing the following equations:

$$m=(CUT2-CUT1)/(REF2-REF1) \quad b=CUT2-m*REF2$$

wherein CUT1, CUT2, REF1, and REF2 are defined above with reference to operation 2302. Note that operation 2304 can be implemented in any manner similar to that described herein, but is not limited to such.

At operation 2306, the reference model can be transformed to derive a component under test model. Note that operation 2306 can be implemented in a wide variety of ways. For example in an embodiment, the reference model ($RO_{REF}$) can be transformed at operation 2306 to derive a component under test model ($RO_{CUT}$) by utilizing the following equation:

$$RO_{CUT}(t,v)=m*RO_{REF}(t,v)+b$$

wherein m and b are defined above with reference to operation 2304. It is pointed out that operation 2306 can be implemented in any manner similar to that described herein, but is not limited to such.

Figure 24:
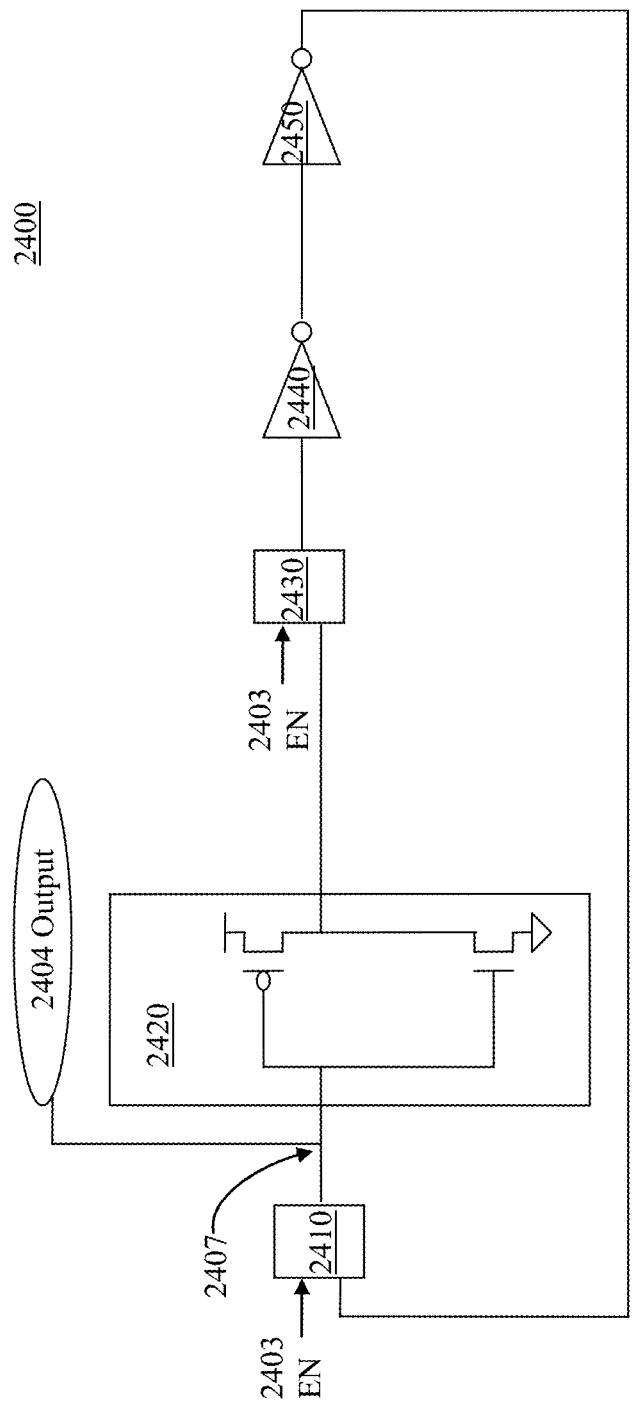
FIG. 24 is a block diagram of an exemplary standard ring oscillator in accordance with one embodiment of the invention.

FIG. 24 is a block diagram of exemplary standard (or normal) ring oscillator 2400 in accordance with one embodiment of the invention. In an embodiment, ring oscillator 2400 can be referred to as a non-leakage ring oscillator, but is not limited to such. Ring oscillator 2400 includes driven inverters 2420, 2440 and 2450, and control logic components 2410 and 2430. The components are coupled in series in a ring path. Driven inverter 2420 includes an NMOS transistor and a PMOS transistor.

The components of ring oscillator 2400 cooperatively operate to oscillate a signal. In one embodiment, oscillations include inversions of a signal state. Driven inverters 2420, 2440, and 2450 switch on and off states in response to a drive signal. The control logic components 2410 and 2430 can control a signal and drive the signal to a value. An enable signal 2403 can be used to "enable" control logic components 2410 and 2430. While the present embodiment of oscillation ring 2400 is shown with the same enable signal 2403 "enabling" logic components 2410 and 2430, it is appreciated that a different respective enable signal can be used to "enable" each of the logic components 2410 and 2430. Driven inverter 2450 switches on and off states in response to a drive signal. Ring oscillator has a split 2407 in the ring path that forwards an output 2404. The state of output 2404 is similar to the state of an input to inverter 2420.

It is noted that high power densities and increasingly sophisticated cooling solutions have become a staple of cutting edge graphics processor units (GPUs) as leakage and active power densities have increased. Better understanding of on die temperature and temperature variations across the chip during various modes of operation has hence become more and more important. Unfortunately a common on die temperature sensor, which uses a thermal diode, is prohibitively large and is generally placed outside the hottest most densely packed sections of the chip. Thermal solutions teams hence have to rely on either IR spectroscopy of the bare exposed silicon (with no heat sink) or simulation on thermal analysis, both of which are inaccurate. Increased power densities as well as conservative margins to account for hotspot uncertainty has led to cooling solutions that contribute a significant amount to the total power consumption as well as board cost.

In an embodiment, a leakage sensitive ring oscillator (e.g. 100, 300, or 500) can be implemented that exhibits extreme temperature sensitivity and can be implemented in an area 100 times smaller than a thermal diode and corresponding circuitry. In one embodiment, the leakage ring oscillator (e.g. 100, 300, or 500) can consists of a skewed leakage current limited inverter and a C-element ring oscillator design as described herein, but is not limited to such. In an embodiment, either the pull down current or delay can be limited by the leakage current of an OFF NMOS device in the NLEAK inverter or the pull up current or delay can be limited by the leakage current of an OFF PMOS device in a PLEAK inverter. Note that in one embodiment, the leakage current limited delay is so large it dominates the ring oscillator frequency, which can be digitally measured with a counter. Since leakage current has a very strong dependence on temperature and is relatively insensitive to voltage, this type of leakage ring oscillator can serve as an excellent temperature sensor in accordance with various embodiments.

In an embodiment, since the total area of the leakage ring oscillator and counter involved in digitally measuring the frequency is 100 times smaller than the size of the thermal diode circuitry, it can be inexpensively distributed across the chip. Note that better understanding of chip circuitry behavior and more accurate sensing capabilities across the chip can enable cheaper and more efficient thermal solutions. In addition, this can directly translate to lower board cost and higher performance per watt.

Present systems and methods can facilitate examination and analysis of leakage characteristics. In one embodiment, the leakage current limited delay is so large it dominates the ring oscillator frequency, which can be digitally measured with a counter. In one embodiment, there is a 50% duty cycle output similar to a clock, with frequency and duty cycle both determined by a slow transition, which can be used to drive a counter. In one exemplary implementation, the present operation examination approaches facilitate utilization of relatively small ring oscillations with asymmetric delay devices that achieve proper polarities. The present approaches can also allow for operation examination components to be selectively turned on and off facilitating further conservation of power consumption. The present approaches facilitate more monitoring structures to be instantiated than conventional attempts and at a lower area cost. The present approaches also facilitate closer monitoring of process and operating parameters. Present leakage inversion systems and methods can facilitate confirmation of chip compliance with design specifications and detection of manufacturing process irregularities. In an embodiment, output(s) from one or more leakage ring oscillators can be utilized to determine the temperature at the location(s) of the one or more leakage ring oscillators during operation of a chip. In one embodiment, a leakage ring oscillator is located in close proximity to a standard ring oscillator, and output from the leakage ring oscillator and output from the standard ring oscillator can be utilized together to determine the temperature and voltage at the location of the leakage ring oscillator and standard ring oscillator during operation of a chip.

Portions of the detailed description are presented and discussed in terms of a method. Although steps and sequencing thereof are disclosed in figures herein describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed within a computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "processing", "computing", "calculating", "determining", "displaying", "accessing," "writing," "including," "storing," "transmitting," "traversing," "associating," "identifying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Some embodiments may be described in the general context of computer-executable instructions, such as program modules, executed by one or more computers or other devices. Generally, program modules include routines, programs, objects, components, data structures, etc., that perform particular tasks or implement particular abstract data types. Typically the functionality of the program modules may be combined or distributed as desired in various embodiments.

The foregoing descriptions of various specific embodiments in accordance with the invention have been presented for purposes of illustration and description. They are not intended to be exhaustive or to limit the invention to the precise forms disclosed, and many modifications and variations are possible in light of the above teaching. The invention is to be construed according to the Claims and their equivalents.

What is claimed is:
1. A system comprising:
a first sensor comprising a leakage ring oscillator that comprises a Muller C-element;
a second sensor comprising a non-leakage ring oscillator;
an analysis component coupled to receive an output from said first and second sensors, said analysis component for performing a method comprising:
modeling and calibrating said first and second sensors that are part of a semiconductor device; and determining a temperature and voltage at said location together based on data received from said first and second sensors.

2. The system of claim 1, wherein said first sensor is located next to said second sensor.

3. The system of claim 1, wherein said determining further comprises triggering said first sensor and said second sensor at substantially the same time.

4. The system of claim 1, wherein said leakage ring oscillator comprises a leakage inverter.

5. The system of claim 1, wherein said determining comprises performing iterative solving of models representing said first and second sensors.

6. The system of claim 1, wherein said determining comprises utilizing a regression analysis.

7. The system of claim 1, wherein said determining comprises utilizing a first model representing said first sensor and a second model representing said second sensor.

8. A system comprising: a first sensor comprising a leakage ring oscillator that comprises a Muller C-element;
a second sensor comprising a non-leakage ring oscillator;
an analysis component coupled to receive an output from both said first and second sensors, said analysis component for performing a method comprising:
modeling and calibrating said first and second sensors that are part of a semiconductor device, said first and second sensors are implemented as a pair at a location of said semiconductor device; and
determining a temperature and voltage at said location together based on data received from said first and second sensors.

9. The system of claim 8, wherein said first sensor is located next to said second sensor.

10. The system of claim 8, wherein said determining further comprises triggering said first sensor and said second sensor at substantially the same time.

11. The system of claim 8, wherein said leakage ring oscillator comprises a leakage inverter.

12. The system of claim 8, wherein said determining comprises performing iterative solving of models representing said first and second sensors.

13. The system of claim 8, wherein said determining comprises utilizing a regression analysis.

14. The system of claim 8, wherein said determining comprises utilizing a first model representing said first sensor and a second model representing said second sensor.

15. The system of claim 8, wherein said first sensor comprises a temperature sensitive sensor.

16. A system comprising:
a temperature sensitive sensor comprising a leakage ring oscillator that comprises a Muller C-element;
a voltage sensitive sensor comprising a non-leakage ring oscillator;
an analysis component coupled to receive an output from said temperature sensitive sensor and said voltage sensitive sensor, said analysis component for performing a method comprising:
modeling and calibrating said voltage sensitive sensor and said temperature sensitive sensor that are part of a semiconductor device; and
determining a temperature and voltage based on data received from said voltage sensitive sensor and said temperature sensitive sensor.

17. The system of claim 16, wherein said temperature sensitive sensor is located next to said voltage sensitive sensor.

18. The system of claim 16, wherein said determining further comprises triggering said first sensor and said second sensor at substantially the same time.

19. The system of claim 16, wherein said leakage ring oscillator comprises a leakage inverter.

20. The system of claim 16, wherein said determining comprises performing iterative solving of models representing said temperature sensitive sensor and said voltage sensitive sensor.

* * * * *